US011393767B2

(12) United States Patent
Bae et al.

(10) Patent No.: US 11,393,767 B2
(45) Date of Patent: Jul. 19, 2022

(54) SEMICONDUCTOR PACKAGE AND PACKAGE-ON-PACKAGE DEVICES INCLUDING SAME

(71) Applicant: SAMSUNG ELECTRONICS CO., LTD., Suwon-si (KR)

(72) Inventors: Sunghawn Bae, Suwon-si (KR); Sunghoan Kim, Suwon-si (KR); Jeongrim Seo, Ansan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 141 days.

(21) Appl. No.: 17/007,158

(22) Filed: Aug. 31, 2020

(65) Prior Publication Data

US 2021/0225773 A1 Jul. 22, 2021

(30) Foreign Application Priority Data

Jan. 21, 2020 (KR) .......................... 10-2020-0007963

(51) Int. Cl.
*H01L 23/538* (2006.01)
*H01L 23/31* (2006.01)
*H01L 23/00* (2006.01)
*H01L 25/10* (2006.01)

(52) U.S. Cl.
CPC ...... *H01L 23/5389* (2013.01); *H01L 23/3128* (2013.01); *H01L 23/5383* (2013.01); *H01L 23/5386* (2013.01); *H01L 24/19* (2013.01); *H01L 24/20* (2013.01); *H01L 25/105* (2013.01);

(Continued)

(58) Field of Classification Search
CPC ............. H01L 23/5389; H01L 23/3128; H01L 23/5383; H01L 23/5386; H01L 24/19; H01L 24/20; H01L 25/105; H01L 2224/214; H01L 2225/1035; H01L 2225/1058

See application file for complete search history.

(56) References Cited

U.S. PATENT DOCUMENTS

| 5,872,399 A | 2/1999 | Lee |
| 6,429,048 B1 | 8/2002 | McLellan et al. |
| 7,728,431 B2 | 6/2010 | Harada et al. |

(Continued)

FOREIGN PATENT DOCUMENTS

| KR | 10-2006-0067757 A | 6/2006 |
| KR | 10-2012-0015988 A | 2/2012 |

*Primary Examiner* — Kyoung Lee
*Assistant Examiner* — Christina A Sylvia
(74) *Attorney, Agent, or Firm* — Volentine, Whitt & Francos, PLLC

(57) ABSTRACT

A semiconductor package includes a redistribution layer, a semiconductor chip disposed on the redistribution layer and an expanded layer surrounding the semiconductor chip, connection terminals on the expanded layer, and a wiring structure electrically connecting the redistribution layer to the connection terminals. Each of the connection terminal includes a seed layer, a terminal base layer including a terminal groove exposing a part of an upper surface of the seed layer on the seed layer and formed of a first metal, a terminal cover layer including a barrier portion filling the terminal groove and a cover base portion covering the barrier portion and the terminal base layer and formed of a second metal, and a terminal protective layer covering the terminal cover layer and formed of a third metal.

20 Claims, 32 Drawing Sheets

(52) U.S. Cl.
CPC *H01L 2224/214* (2013.01); *H01L 2225/1035* (2013.01); *H01L 2225/1058* (2013.01)

(56) References Cited

U.S. PATENT DOCUMENTS

| | | | |
|---|---|---|---|
| 8,283,754 B2 | 10/2012 | Lin et al. | |
| 8,963,331 B2 | 2/2015 | Zhang et al. | |
| 9,504,152 B2 | 11/2016 | Liu | |
| 9,831,148 B2* | 11/2017 | Yu | H01L 24/16 |
| 10,134,698 B2 | 11/2018 | Chen et al. | |
| 2003/0193094 A1 | 10/2003 | Takahashi et al. | |
| 2010/0244241 A1* | 9/2010 | Marimuthu | H01L 21/56 257/737 |
| 2015/0027760 A1 | 1/2015 | Cho et al. | |
| 2016/0005702 A1* | 1/2016 | Shih | H01L 24/14 257/737 |
| 2018/0315620 A1* | 11/2018 | Lee | H01L 24/05 |

* cited by examiner

SEMICONDUCTOR PACKAGE AND PACKAGE-ON-PACKAGE DEVICES INCLUDING SAME

CROSS-REFERENCE TO RELATED APPLICATION

This application claims the benefit of Korean Patent Application No. 10-2020-0007963 filed on Jan. 21, 2020 in the Korean Intellectual Property Office, the subject matter of which is hereby incorporated by reference.

BACKGROUND

The inventive concept relates to semiconductor packages and package-on-package (PoP) semiconductor devices. More particularly, the inventive concept relates to fan-out type semiconductor packages and PoP semiconductor devices including same.

With the rapid development of electronics industry and demands of users, electronic devices have become smaller, perform multiple functions, and have large data storage capacities. Therefore, highly integrated semiconductor chips are required.

In order to provide highly integrated semiconductor chips with an increased number of connection terminals, semiconductor packages including connection terminals with secured connection reliability are required. For example, in order to prevent interference between the connection terminals, fan-out type semiconductor packages include connection terminals that are more widely spaced apart.

SUMMARY

The inventive concept provides a semiconductor package with connection terminals providing improved connection reliability, as well as package-on-package (PoP) semiconductor devices including same.

According to an aspect of the inventive concept, there are provided a semiconductor package including; a redistribution layer, a semiconductor chip disposed on the redistribution layer and an expanded layer at least partially surrounding the semiconductor chip, connection terminals on the expanded layer, and a wiring structure electrically connecting the redistribution layer to the connection terminals, wherein each of the connection terminals comprises a seed layer, a terminal base layer including a terminal groove exposing a portion of an upper surface of the seed layer on the seed layer and formed of a first metal, a terminal cover layer including a barrier portion filling the terminal groove and a cover base portion covering the barrier portion and the terminal base layer and formed of a second metal, and a terminal protective layer covering the terminal cover layer and formed of a third metal.

According to an aspect of the inventive concept, there are provided a semiconductor package including; a redistribution layer, a semiconductor chip disposed on the redistribution layer and an expanded layer at least partially surrounding the semiconductor chip, a cover insulating layer covering the expanded layer and having a via opening, a connection terminal including a connection via filling the via opening and connection pads connected to the connection via and disposed on an upper surface of the cover insulating layer, and a wiring structure electrically connecting the redistribution layer to the connection terminal, wherein the connection terminal comprises a terminal base layer including a terminal groove, a terminal cover layer including a barrier portion filling the terminal groove and a cover base portion covering the barrier portion and the terminal base layer, and a terminal protective layer covering the terminal cover layer and a dent is provided along the barrier portion in an upper surface of the connection terminal.

According to an aspect of the inventive concept, there are provided a package-on-package (PoP) semiconductor device, including; a first semiconductor package including a redistribution layer, a first semiconductor chip disposed on the redistribution layer and an expanded layer at least partially surrounding the first semiconductor chip, a cover insulating layer covering the expanded layer and having a via opening, and a connection terminal filing the via opening and extending to an upper surface of the cover insulating layer to be electrically connected to the redistribution layer, and a second semiconductor package, vertically stacked on the first semiconductor device, and including a second semiconductor chip and a package connection terminal attached to the connection terminal to electrically connect the second semiconductor chip to the first semiconductor package, herein the connection terminal comprises a terminal base layer with a terminal groove, a terminal cover layer including a barrier portion filling the terminal groove and a cover base portion covering the terminal base layer, and a terminal protective layer covering the terminal cover layer and, a dent provided along the barrier portion in an upper surface of the connection terminal.

BRIEF DESCRIPTION OF THE DRAWINGS

Embodiments of the inventive concept may be more clearly understood upon consideration of the following detailed description taken in conjunction with the accompanying drawings in which.

DETAILED DESCRIPTION

Certain embodiments of the inventive concept will now be described in some additional detail with reference to the accompanying drawings. Throughout the written description and drawings, like reference numbers and labels are used to denote like or similar elements.

Throughout the written description certain geometric terms may be used to highlight certain relative relationships between elements, components and/or features with respect to certain embodiments of the inventive concept. Those skilled in the art will recognize that such geometric terms are relative in nature, arbitrary in descriptive relation and/or directed to aspect(s) of the illustrated embodiments. Geometric terms may include, for example: above/below; under/over; upper/lower; uppermost/lowermost; center/edge; vertical/horizontal; surround; periphery; overlap/underlay; beside; parallel, etc.

Figure 1A:
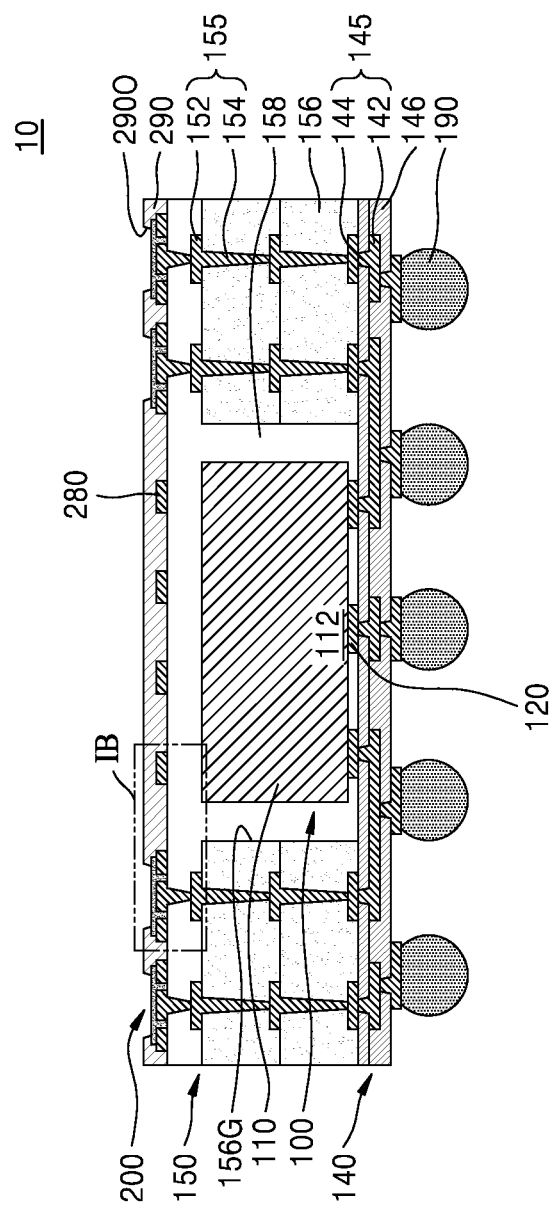
FIG. 1A is a cross-sectional view of a semiconductor package according to embodiments of the inventive concept and FIG. 1B is a partial cross-sectional view illustrating a connection terminal of a semiconductor package according to embodiments of the inventive concept.
Figure 1B:
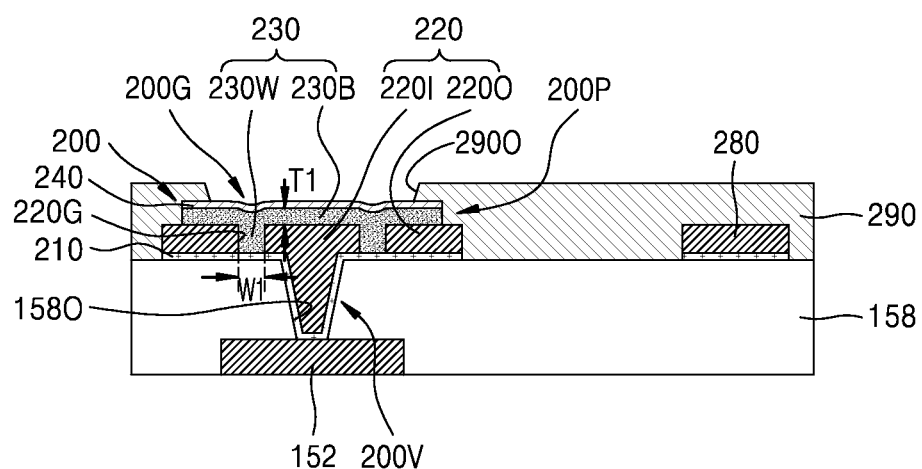

Figure (FIG. 1A is a cross-sectional view of a semiconductor package 10 according to embodiments of the inventive concept, and FIG. 1B is a partial cross-sectional view further illustrating a connection terminal for the semiconductor package 10 according to embodiments of the inventive concept.

Hereinafter for the sake of clarity, partial cross-sectional views, like FIG. 1B, illustrating a connection terminal for a semiconductor package illustrate only an upper surface of an uppermost wiring pattern 152.

Referring to FIGS. 1A and 1B, the semiconductor package 10 may include a redistribution layer 140, an expanded layer 150 disposed on the redistribution layer 140 and including a groove 156G, wherein at least one semiconductor chip 100 ("semiconductor chip 100") disposed in the groove 156G. With this configuration, the expanded layer 150 may at least partially surround the semiconductor chip 100.

The semiconductor package 10 may be a fan-out type semiconductor package. In some embodiments, the expanded layer 150 may be a panel board and the semiconductor package 10 may be a fan-out panel level package (FOPLP). In some embodiments, a horizontal width and a horizontal area of the groove 156G may have respective values greater than a horizontal width and a horizontal area of the semiconductor chip 100. Inner side surfaces of the groove 156G may be spaced opposing side surfaces of the semiconductor chip 100.

The semiconductor chip 100 may include a semiconductor substrate 110 on which an active surface of a semiconductor device 112 is disposed, and chip connection pads 120 disposed between the active surface of the semiconductor device 112 and the semiconductor substrate 110. In some embodiments, when the semiconductor package 10 is a lower package in a package-on-package (PoP) structure, a combination of the semiconductor package 10, the semiconductor chip 100, the semiconductor substrate 110, the semiconductor device 112, and the chip connection pads 120 may be respectively referred to as a first semiconductor package, a first semiconductor chip, a first semiconductor substrate, a first semiconductor device, and first chip connection pads.

The semiconductor substrate 110 may include one or more semiconductor material(s), such as silicon (Si) and germanium (Ge), or a compound semiconductor material such as silicon carbide (SiC), gallium arsenide (GaAs), indium arsenide (InAs), or indium phosphide (InP). The semiconductor substrate 110 may include conductive region(s) (e.g., regions selected doped with one or more impurities). The semiconductor substrate 110 may have various device isolation structures, such as a shallow trench isolation (STI) structure.

The semiconductor device 112 possibly including various kinds of circuitry and/or devices may be disposed on the semiconductor substrate 110. Exemplary devices in this regard include various microelectronic devices, such as a metal-oxide-semiconductor field effect (MOSFET) transistor such as a complementary metal-insulator-semiconductor (CMOS) transistor, an image sensor such as a system large scale integration (LSI) or a CMOS imaging sensor (CIS), a micro-electro-mechanical system (MEMS), an active device, and/or a passive device. The devices may be variously connected to conductive element(s) or area(s) of the semiconductor substrate 110. The semiconductor device 112 may further include conductive wiring and/or conductive plugs variously connecting the devices to the conductive element(s) and area(s) of the semiconductor substrate 110. Here, each of the devices may be electrically isolated from neighboring device(s) by one or more insulating layer(s).

The semiconductor chip 100 may be, for example, a central processing unit (CPU) chip, a graphic processing unit (GPU) chip, or an application processor (AP) chip. In some embodiments, when the semiconductor package 10 includes multiple semiconductor chips 100, some of the semiconductor chips 100 may be, for example, dynamic random access memory (DRAM) chips, static random access memory (SRAM) chips, flash memory chips, electrically erasable and programmable read-only memory (EEPROM) chips, phase-change random access memory (PRAM) chips, magnetic random access memory (MRAM) chips, or resistive random access memory (RRAM) chips.

The redistribution layer 140 may include a redistribution conductive structure 145 and at least one redistribution insulating layer 146. The redistribution conductive structure 145 may include redistribution line patterns 142 disposed on at least one of upper and lower surfaces of the redistribution insulating layer 146 and/or the redistribution conductive structure 145, and respectively contacting at least one of the redistribution line patterns 142 through a portion of the redistribution insulating layer 146.

The redistribution line patterns 142, as well as redistribution via patterns 144, may be formed of one or more metal(s), such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), or ruthenium (Ru) or an alloy of the above metals. However, the inventive concept is not limited thereto.

At least some of the redistribution line patterns 142 may be formed and integrated with some of the redistribution via patterns 144. For example, some of the redistribution line patterns 142 may be formed and integrated with some of the redistribution via patterns 144 by contacting upper and/or lower surfaces of the redistribution line patterns 142.

In some embodiments, the redistribution via patterns 144 may be tapered such that each of the redistribution via patterns 144 extends with a decreasing horizontal width from a lower surface to an upper surface. That is, each of the redistribution via patterns 144 may have a horizontal width that increases (or tapers-outwardly) as the respective redistribution via patterns 144 extend away from the semiconductor chip 100.

A redistribution seed layer may be interposed between the redistribution insulating layer 146 and the redistribution line patterns 142 and the redistribution via patterns 144. For example, the redistribution seed layer may be formed using a physical vapor deposition (PVD) process (e.g., by performing electroless plating). In some embodiments, the redistribution seed layer may be interposed between upper surfaces of the redistribution line patterns 142 and the redistribution via patterns 144 and the redistribution insulating layer 146, as well as between side surfaces of the redistribution via patterns 144 and the redistribution insulating layer 146.

The redistribution seed layer may be formed from one or more metal(s), such as Cu, Ti, TiW, TiN, Ta, TaN, chrome (Cr), and Al. However, the inventive concept is not limited thereto. In some embodiments, the redistribution seed layer may be formed of Cu/Ti obtained by stacking Cu on Ti or Cu/TiW obtained by stacking Cu on TiW.

In some embodiments, when Cu is used to form the redistribution line patterns 142 and the redistribution via patterns 144, at least a portion of the redistribution seed layer may act as a diffusion barrier layer.

The redistribution insulating layer 146 may be formed of an organic compound, such as an organic polymer. In some embodiments, the redistribution insulating layer 146 may be formed of a photosensitive polyimide (PSPI).

The chip connection pads 120 of the semiconductor chip 100 may be connected to the redistribution conductive structure 145. In some embodiments, an uppermost redistribution pattern 144, among the redistribution via patterns 144, may contact the chip connection pads 120. However, the inventive concept is not limited thereto. In other embodiments, an uppermost redistribution pattern 142, among the redistribution line patterns 142, may contact the chip connection pads 120. External connection terminals 190 may be attached to the redistribution conductive structure 145, and may contact a lower surface of the redistribution layer 140. In some embodiments, an uppermost redistribution line pattern 142, among the redistribution line patterns 142, may serve as terminal connection pads for the external connection terminals 190.

The expanded layer 150 may be, for example, a printed circuit board (PCB), a ceramic substrate, a package manufacturing wafer, or an interposer. In some embodiments, the expanded layer 150 may be a multi-layer PCB. In this regard, the groove 156G forms an opening or cavity in the expanded layer 150. For example, the groove 156G may be formed in a center area of the expanded layer 150. The groove 156G may be recessed or opened from an upper surface of the expanded layer 150 to a predetermined depth. In order to recess or open the expanded layer 150, a dry etch process, a wet etch process, a screen print process, a drill bit process, or a laser drilling process may be used.

The expanded layer 150 may include a wiring structure 155 and a substrate base 156. The wiring structure 155 may include multiple wiring patterns 152 and/or multiple conductive vias 154. The wiring structure 155 may be formed of Cu, Ni, stainless steel, or BeCu.

The substrate base 156 may be formed of at least one material selected from a group of materials including: phenol resin, epoxy resin, and polyimide. The semiconductor substrate 110 may include at least one material selected from a group of materials including: frame retardant 4 (FR4), tetrafunctional epoxy, plyphenylene ether, epoxy/polyphenylene oxide, bismaleimide triazine (BT), thermount, cyanate ester, polyimide, and liquid crystal polymer.

In some embodiments, the substrate base 156 of the expanded layer 150 be a multilayer substrate including multiple material layers. The expanded layer 150 may include the wiring patterns 152 disposed between overlaying material layers of the substrate base 156

The expanded layer 150 may further include conductive vias 154 passing through various material layers of the substrate base 156 to electrically connect various wiring patterns 152 disposed on different wiring layers. Here, the term "wiring layer" means a vertical location from which a horizontal electrical path extends between an upper surface and a lower surface of the material layers in the substrate base 156 of the expanded layer 150. Accordingly, the expanded layer 150 may include a greater number of wiring layers than material layers.

The semiconductor package 10 may further include a cover insulating layer 158 filling gap(s) between the semiconductor chip 100 and the expanded layer 150. The cover insulating layer 158 may be formed (e.g.) of a thermosetting resin such as epoxy resin, thermoplastic resin such as polyimide, or a resin obtained by adding reinforcement such as an inorganic filler to thermosetting resin and thermoplastic resin (e.g., Ajinomoto build-up film (ABF), FR-4, and/or BT). Alternatively, the cover insulating layer 158 may be formed of a molding material such as an epoxy mold compound (EMC) or a photosensitive material such as a photoimagable encapsulant (PIE). The cover insulating layer 158 may include a via opening 158O through which a portion of the uppermost wiring pattern 152 in the wiring structure 155 is exposed. The via opening 158O may be tapered to have a decreasing horizontal width as it extends from an upper surface to a lower surface. In some embodiments, the horizontal width of the via opening 158O may fall in a range of dozens of μms.

In some embodiments, the cover insulating layer 158 may be formed by depositing silicon oxide to a predetermined thickness and then, filling polymer such as lock polyimide in a portion of the groove 156G, which is not filled with silicon oxide.

In other embodiments, the cover insulating layer 158 may be formed such that an inactive surface portion of the semiconductor chip 100 and upper surface(s) of the expanded layer 150 are covered with polymer such as polyimide, side surfaces and an inactive surface of the semiconductor chip 100 are completely wrapped, and the inactive surface of the semiconductor chip 100 is not exposed.

In other embodiments, the cover insulating layer 158 may be formed such that polymer such as polyimide is formed to expose the inactive surface of the semiconductor chip 100 and the inactive surface of the semiconductor chip 100 and the upper surface of the expanded layer 150 are covered with an insulating material. The insulating material may be, for example, a silicon oxide layer, a silicon nitride layer, or a silicon oxynitride layer.

On the expanded layer 150, connection terminals 200 may electrically connect the wiring structure 155. For example, the connection terminals 200 may be electrically connected to the wiring structure 155 through the cover insulating layer 158. In some embodiments, the connection terminals 200 may contact the uppermost wiring pattern 152 in the wiring structure 155. Here, portion(s) of the uppermost wiring pattern 152 contacting the connection terminals 200 may be referred to as an upper surface pad.

Each of the connection terminals 200 may include a connection via 200V filling the via opening 158O extending from an upper surface of the cover insulating layer 158 to an upper surface of the uppermost wiring pattern 152 in the wiring structure 155 and passing through the cover insulating layer 158 and a connection pad 200P connected to the connection via 200V and disposed on the upper surface of the cover insulating layer 158.

Each of the connection terminals 200 may include a seed layer 210, a terminal base layer 220, a terminal cover layer 230, and a terminal protective layer 240. The terminal base layer 220 may be formed of a first metal, the terminal cover layer 230 may be formed of a second metal, and the terminal protective layer 240 may be formed of a third metal. The seed layer 210 may include the first metal.

Here, the third metal may have an electro-potential higher than that of the second metal, and the second metal may have an electro-potential higher than that of the first metal. In this regard, a "high" electro-potential may have a positive value and a "low" electro-potential may have a negative value. For example, the first metal may be Cu, the second metal may be Ni, and the third metal may be gold (Au).

The seed layer 210 may cover a portion of the upper surface of the cover insulating layer 158 and an internal surface and a bottom surface of the via opening 158O. The seed layer 210 may cover a portion of the upper surface of the uppermost wiring pattern 152 in the wiring structure 155 exposed at the bottom surface of the via opening 158O, a surface of the cover insulating layer 158 of the internal surface of the via opening 158O, and a part of the upper surface of the cover insulating layer 158 adjacent to the via opening 158O. For example, the seed layer 210 may include Cu. In some embodiments, the seed layer 210 may have a stacked structure of Ti/Cu.

The terminal base layer 220 filling the via opening 158O and covering a portion of the upper surface of the cover insulating layer 158 may be dispose on the seed layer 210. The terminal base layer 220 may include a terminal groove 220G exposing a portion of an upper surface of the seed layer 210. The terminal groove 220G may extend from an upper surface of the terminal base layer 220 to a lower surface of the terminal base layer 220. The terminal groove 220G may have a circular ring shape. The terminal groove 220G may be horizontally adjacent to the via opening 158O and may at least partially surround the via opening 158O. The terminal base layer 220 may be formed by performing electroless plating using the seed layer 210 as a seed. For example, the terminal base layer 220 may include Cu.

The terminal base layer 220 may include an internal base portion 220I disposed inside a barrier portion 230W of the terminal cover layer 230 (as described in some additional detail hereafter) and an external base portion 220O disposed outside the barrier portion 230W of the terminal cover layer 230. The internal base portion 220I and the external base portion 220O of the terminal base layer 220 of each of the connection terminals 200 may be spaced apart from each other with the barrier portion 230W interposed. In the internal base portion 220I, a portion positioned in the via opening 158O may be a part of the connection via 200V. In the internal base portion 220I, a portion positioned outside the via opening 158O, that is, a portion positioned at a level higher than the upper surface of the cover insulating layer 158 and the external base portion 220O may be a part of the connection pad 200P.

The terminal cover layer 230 may be disposed on the seed layer 210 and the terminal base layer 220. The terminal cover layer 230 may include the barrier portion 230W filling the terminal groove 220G and a cover base portion 230B covering the terminal base layer 220 and the barrier portion 230W. The barrier portion 230W may be a ring-shaped cylinder. The barrier portion 230W may be horizontally adjacent to the via opening 158O and may at least partially surround the via opening 158O. The terminal cover layer 230 may be formed using electroless plating that uses the base layer 220 and the seed layer 210 as a seed. For example, the terminal cover layer 230 may include Ni.

The internal base portion 220I and the external base portion 220O of the terminal base layer 220 of each of the connection terminals 200 may be electrically connected to each other through the seed layer 210 and the barrier portion 230W.

A horizontal width W1 of the barrier portion 230W of the terminal cover layer 230 may have a value greater than that of a thickness T1 of the cover base portion 230B. For example, when the thickness T1 of the cover base portion 230B is 5 μm, the horizontal width W1 of the barrier portion 230W may have a value greater than 5 μm and less than 10 μm. However, the inventive concept is not limited thereto. For example, when a horizontal width of the terminal cover layer 230 is much greater than the horizontal width W1 of the barrier portion 230W, the horizontal width W1 of the barrier portion 230W may have a value of no less than 10 μm. In some embodiments, the horizontal width of the terminal cover layer 230 may have a value of no less than 200 μm.

Because the terminal cover layer 230 may be grown from a surface of the terminal base layer 220 and a surface of the seed layer 210 exposed at a bottom surface of the terminal groove 220G, the terminal cover layer 230 may have a depression (or dent) in an upper surface of the cover base portion 230B along the barrier portion 230W.

In some embodiments, the horizontal width of the terminal cover layer 230 may have a value less than that of a horizontal width of the terminal base layer 220. For example, the edges of the terminal cover layer 230 may be positioned in the terminal cover layer 230 to be spaced apart from edges of the terminal base layer 220.

The terminal protective layer 240 may cover an upper surface of the terminal cover layer 230. In some embodiments, the terminal protective layer 240 may cover all the upper surface of the terminal cover layer 230. For example, the terminal base layer 220 may include Au.

In an upper surface of the terminal protective layer 240, a dent obtained by transcribing the dent of the terminal cover layer 230 may be provided. The dent of the terminal protective layer 240 may be referred to as a dent portion 200G of the connection terminal 200. That is, each of the connection terminals 200 may have the dent portion 200G in an upper surface thereof along the barrier portion 230W filling the terminal groove 220G. The dent portion 200G may have a circular shape. The dent portion 200G may be horizontally adjacent to the connection via 200V filling the via opening 158O and may at least partially surround the connection via 200V.

In some embodiments, the semiconductor package 10 may further include a connection wiring line 280 disposed on the upper surface of the cover insulating layer 158. The connection wiring line 280 may be formed of the same material as the terminal base layer 220. For example, the connection wiring line 280 may include Cu. The connection wiring line 280 may be integrated with at least one terminal base layer 220 among the connection terminals 200 so as to be electrically connected to at least one of the connection terminals 200. The connection wiring line 280 may be formed together with the terminal base layer 220 by forming the seed layer 210 in a portion of the upper surface of the expanded layer 150 excluding a place in which the connection terminals 200 are disposed and performing electroless plating by using the seed layer 210 as the seed.

The semiconductor package 10 may further include a protective insulating layer 290 disposed on the expanded layer 150 and exposing at least a portion of each of the connection terminals 200. For example, the protective insulating layer 290 may be formed of a material layer formed of an organic polymer material. In some embodiments, the protective insulating layer 290 may be formed of PSPI, ABF, or PIE.

In some embodiments, when the semiconductor package 10 includes the connection wiring line 280, the protective insulating layer 290 may surround the connection wiring line 280. For example, the protective insulating layer 290 may cover an upper surface and side surfaces of the connection wiring line 280.

In the semiconductor package 10 according to embodiments of the inventive concept, the barrier portion 230W may be interposed between the internal base portion 220I and the external base portion 220O of the terminal base layer 220. In processes forming the connection terminals 200, by a difference in electro-potential between a metal material forming the terminal protective layer 240 and a metal material forming the terminal base layer 220, Galvanic corrosion occurs in the terminal base layer 220 with electro-potential lower than that of the terminal protective layer 240, such that a portion of the terminal base layer 220 (e.g., a portion of the external base portion 220O) may be damaged. Accordingly, in embodiments of the inventive concept, because the barrier portion 230W formed of a metal material with electro-potential higher than that of the metal material forming the terminal base layer 220 is disposed between the external base portion 220O and the internal base portion 220I, the internal base portion 220I may not be damaged. Therefore, connection reliability of the connection terminals 200 of the semiconductor package 10 may be improved.

FIGS. 2A, 2B, 3, 4A, 4B, 5A, 5B, 6, 7A and 7B are respective, partial cross-sectional views or partial plan views illustrating in one example a method of manufacturing a connection terminal of a semiconductor package according to embodiments of the inventive concept. FIG. 7C is a partial bottom plan view illustrating a terminal cover layer for a connection terminal of a semiconductor package. FIGS. 2B, 4B, 5B, and 7B are partial top plan views of a connection terminal of a semiconductor package and a portion adjacent to the connection terminal of FIGS. 2A, 4A, 5A, and 7A.

Figure 2A:
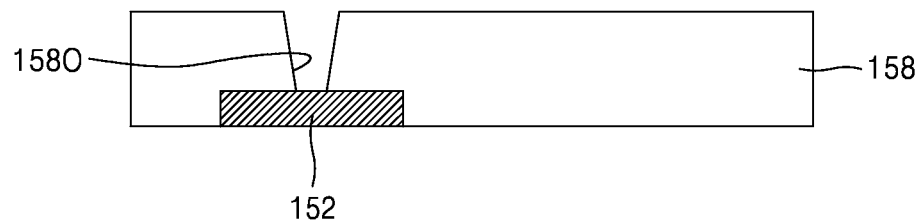
FIGS. 2A, 2B, 3, 4A, 4B, 5A, 5B, 6, 7A and 7B are related partial cross-sectional views and partial plan views illustrating a method of manufacturing a connection terminal of a semiconductor package according to embodiments of the inventive concept.
Figure 2B:
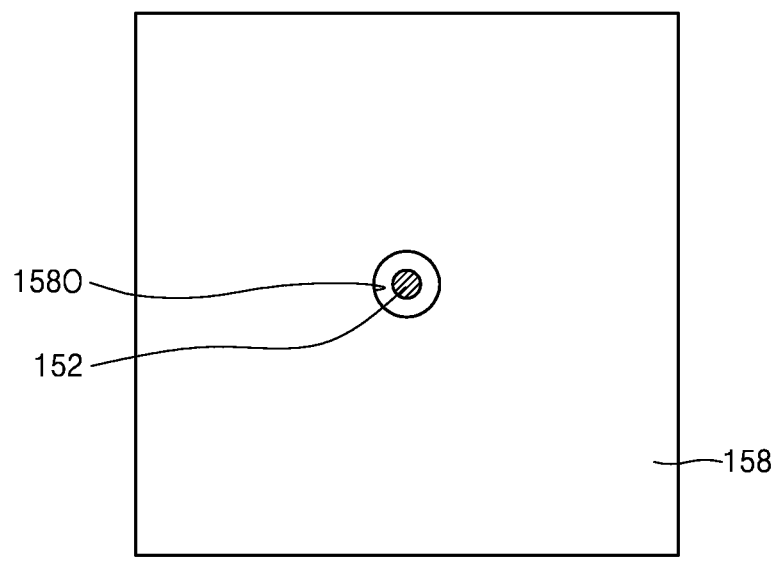

Referring to FIGS. 2A and 2B, the cover insulating layer 158 having the via opening 158O and exposing a portion of the uppermost wiring pattern 152 is formed. The via opening 158O may be tapered such that the via opening 158O extends with the horizontal width reduced from the upper side to the lower side. In some embodiments, the horizontal width of the via opening 158O may fall within a range of dozens of μms. For example, the cover insulating layer 158 may be formed of a silicon oxide layer, a silicon nitride layer, a silicon oxynitride layer, polymer, or a combination of the above materials.

Figure 3:
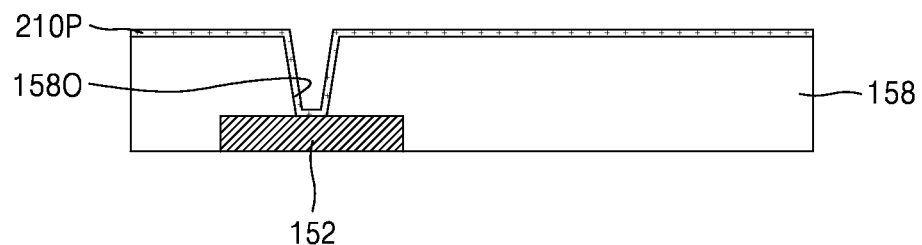

Referring to FIG. 3, a preliminary seed layer 210P covering the surface of the cover insulating layer 158 and the surface of the uppermost wiring pattern 152 exposed by the via opening 158O is formed. The preliminary seed layer 210P may cover a portion of the upper surface of the uppermost wiring pattern 152 exposed at the bottom surface of the via opening 158O, the surface of the cover insulating layer 158 of the internal surface of the via opening 158O, and the upper surface of the cover insulating layer 158. The preliminary seed layer 210P may include the first metal. The first metal may be Cu. In some embodiments, the preliminary seed layer 210P may have the stacked structure of Ti/Cu.

Figure 4A:
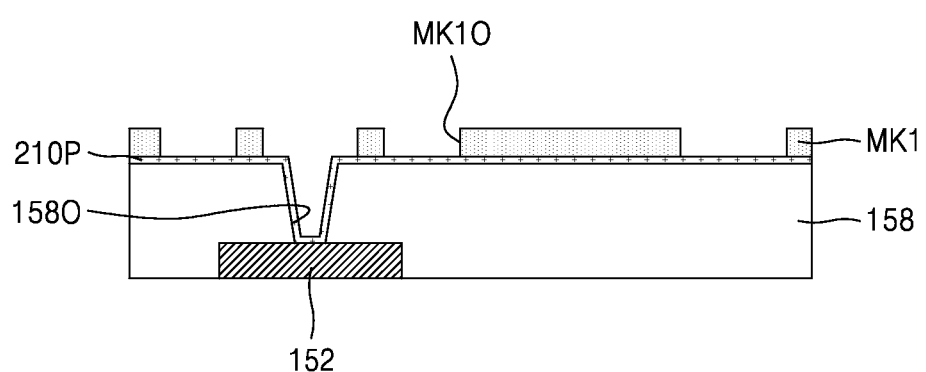
Figure 4B:
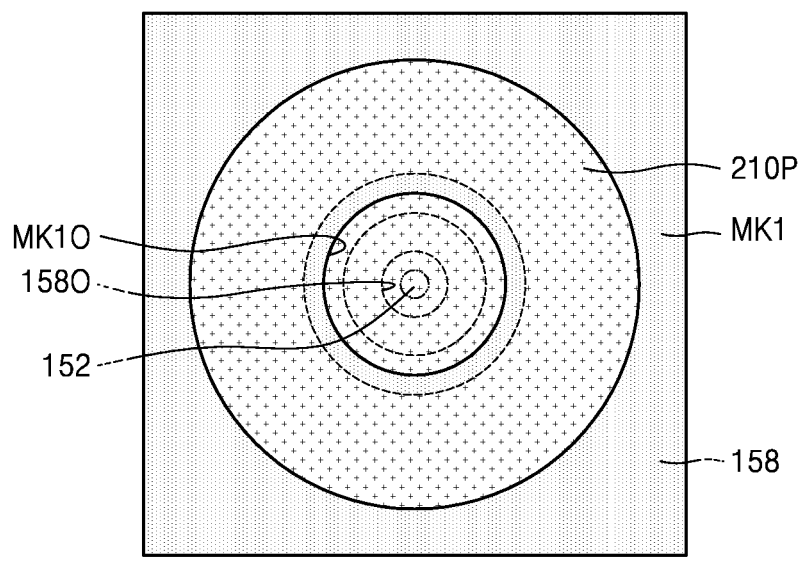
Figure 5A:
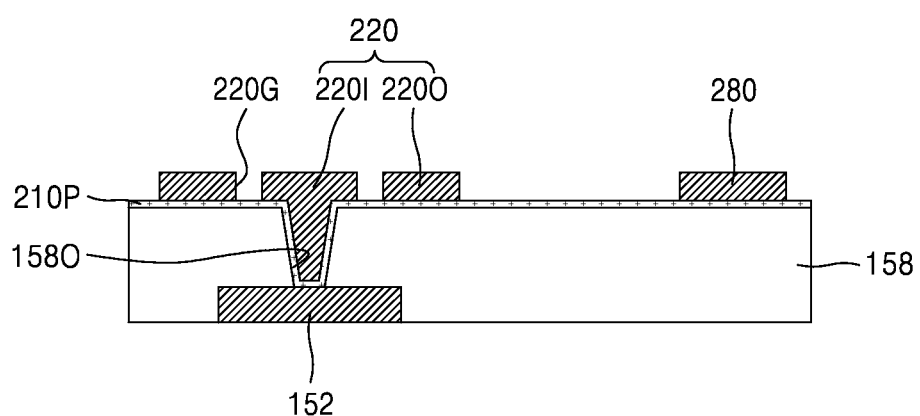
Figure 5B:
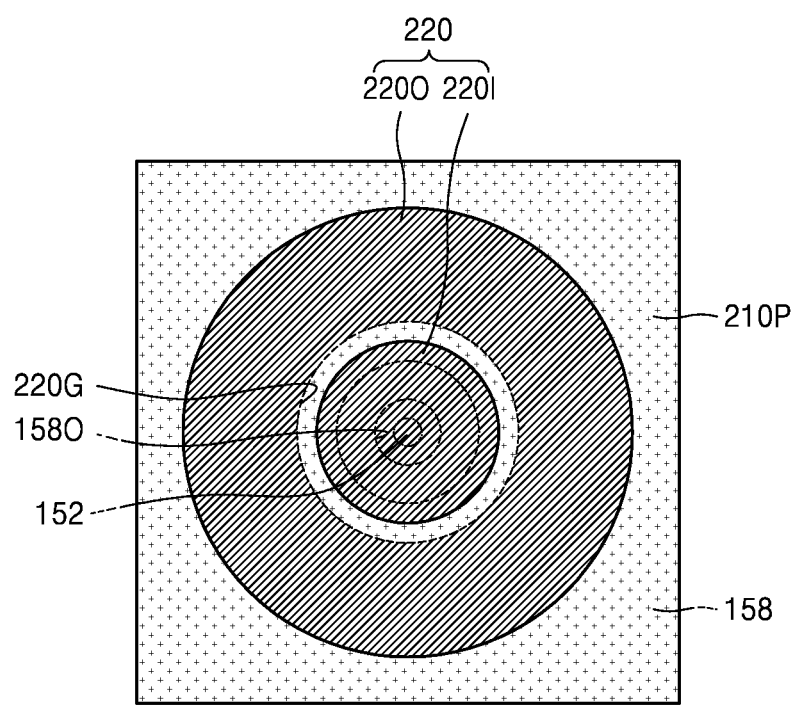

Referring to FIGS. 4A and 4B, on the preliminary seed layer 210P, a first mask layer MK1 with a first mask opening MK1O exposing a portion of an upper surface of the preliminary seed layer 210P is formed. The first mask opening MK1O may correspond to a position in which the terminal base layer 220 and the connection wiring line 280 illustrated in FIG. 1B are disposed.

In some embodiments, the first mask layer MK1 may be formed of photoresist. In other embodiments, the first mask layer MK1 may be formed of photosensitive polyimide.

Referring to FIGS. 4A, 4B, 5A and 5B, the terminal base layer 220 may be formed in a position corresponding to the first mask opening MK1O. For example, the terminal base layer 220 may be formed using electroless plating that uses a portion of the preliminary seed layer 210P exposed at a bottom surface of the first mask opening MK1O as a seed. The terminal base layer 220 may include the first metal. The first metal may be Cu. After forming the terminal base layer 220, the first mask layer MK1 may be removed.

The terminal base layer 220 may include the internal base portion 220I disposed inside and the external base portion 220O disposed outside. A lower portion of the internal base portion 220I may fill the via opening 158O. Between the internal base portion 220I and the external base portion 220O, the terminal groove 220G exposing a portion of the preliminary seed layer 210P may be formed. The internal base portion 220I and the external base portion 220O of the terminal base layer 220 may be spaced apart from each other with the terminal groove 220G interposed. The terminal groove 220G may have a ring-shape. The terminal groove 220G may be horizontally adjacent to the via opening 158O and may at least partially surround the via opening 158O.

In some embodiments, in the process of performing the electroless plating in order to form the terminal base layer 220, the connection wiring line 280 may be formed together. The connection wiring line 280 may be formed of the same material as the terminal base layer 220. For example, the connection wiring line 280 may include Cu.

Figure 6:
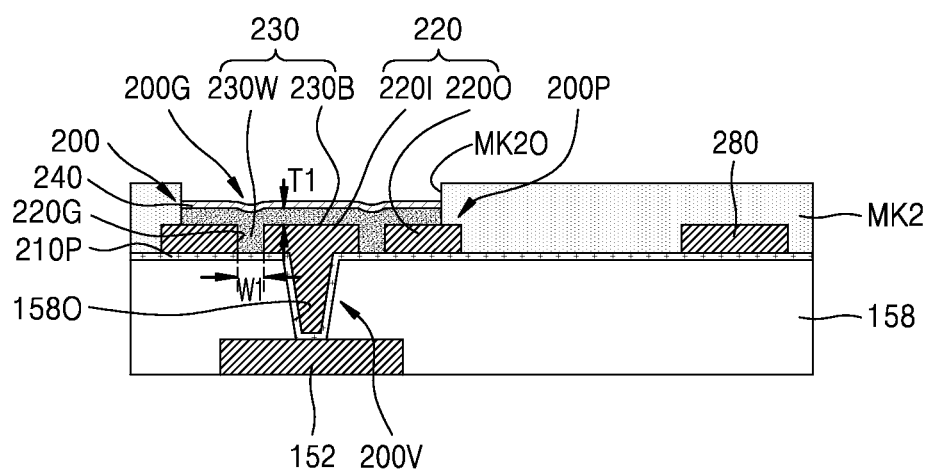
Figure 7A:
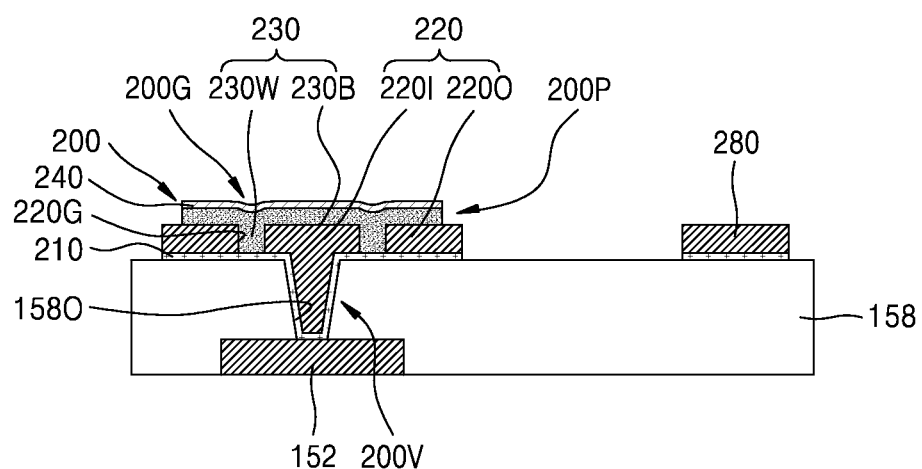
Figure 7B:
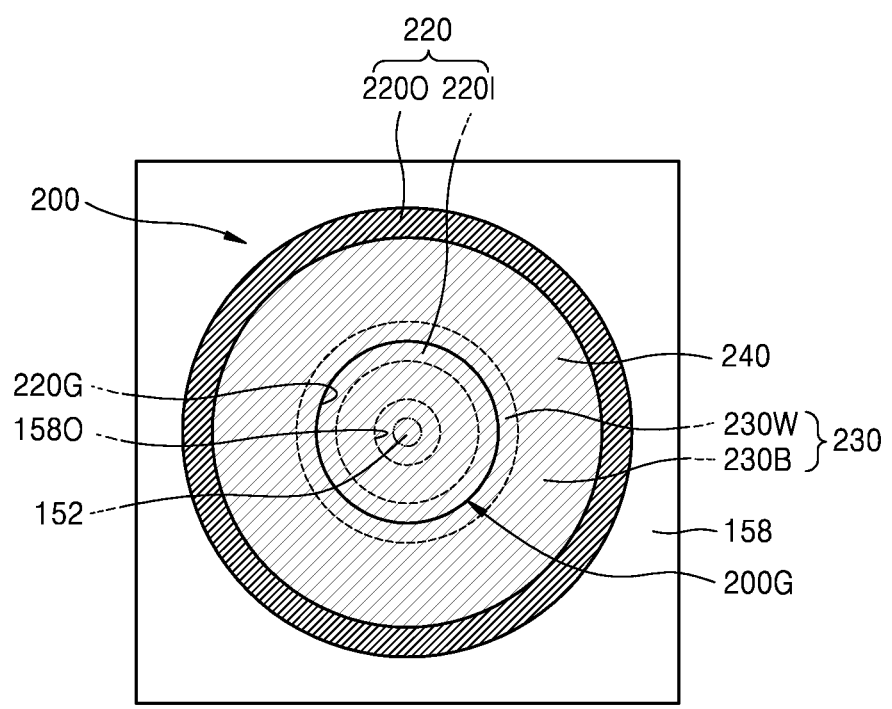
Figure 7C:
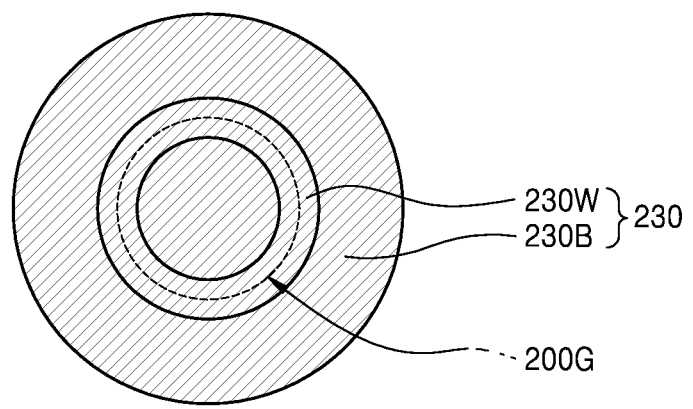
FIG. 7C is a partial bottom plan view of a terminal cover layer of a connection terminal of a semiconductor package.

Referring to FIG. 6, on the preliminary seed layer 210P on which the terminal base layer 220 is formed, a second mask layer MK2 exposing at least a part of the terminal base layer 220 and having a second mask opening MK2O is formed. The second mask opening MK2O may entirely expose the terminal groove 220G. That is, the second mask layer MK2 may not cover the portion of the preliminary seed layer 210P exposed at the bottom surface of the terminal groove 220G. In some embodiments, the second mask layer MK2 may cover an external sidewall of the external base portion 220O of the terminal base layer 220, a portion of an upper surface of the external base portion 220O adjacent to the external sidewall of the external base portion 220O, and a remaining portion of the preliminary seed layer 210P excluding the portion of the preliminary seed layer 210P exposed at the bottom surface of the terminal groove 220G. In some embodiments, the second mask layer MK2 may cover the connection wiring line 280.

In some embodiments, the second mask layer MK2 may be formed of photoresist. In other embodiments, the second mask layer MK2 may be formed of photosensitive polyimide.

Then, the terminal cover layer 230 and the terminal protective layer 240 are sequentially formed on the portion of the terminal base layer 220 and the portion of the preliminary seed layer 210P exposed by the second mask opening MK2O without being covered with the second mask layer MK2.

The terminal cover layer 230 may be formed of the second metal Having an electro-potential higher than that of the first metal. The second metal may be Ni. The terminal protective layer 240 may be formed of the third metal having an electro-potential higher than that of the second metal. The third metal may be Au.

The terminal cover layer 230 may include the barrier portion 230W filling the terminal groove 220G and the cover base portion 230B covering the terminal base layer 220 and the barrier portion 230W. The barrier portion 230W may have a ring shape. The barrier portion 230W may be horizontally adjacent to the via opening 158O and may at least partially surround the via opening 158O. The terminal cover layer 230 may be formed using an electroless plating process that uses the base layer 220 and the preliminary seed layer 210P as a seed. The horizontal width W1 of the barrier portion 230W of the terminal cover layer 230 may have the value greater than that of the thickness T1 of the cover base portion 230B.

The terminal cover layer 230 may be grown from the surface of the terminal base layer 220 and the surface of the seed layer 210 exposed at the bottom surface of the terminal groove 220G. Therefore, the terminal cover layer 230 may have the dent in the upper surface of the cover base portion 230B along the barrier portion 230W and, in the upper surface of the terminal protective layer 240, the dent obtained by transcribing the dent of the terminal cover layer 230 may be provided. The dent of the terminal protective layer 240 may be referred to as the dent portion 200G.

Referring to FIGS. 6, 7A, 7B and 7C, after removing the second mask layer MK2, by removing the exposed portion of the preliminary seed layer 210P, the connection terminal 200 formed of the seed layer 210, the terminal base layer 220, the terminal cover layer 230, and the terminal protective layer 240 may be formed. That is, a portion of the preliminary seed layer 210P covered with the terminal base layer 220, the terminal cover layer 230, and the connection wiring line 280 resides as the seed layer 210 and a remaining portion may be removed.

The connection terminal 200 may include the connection via 200V filling the via opening 158O extending from the upper surface of the cover insulating layer 158 to the upper surface of the uppermost wiring pattern 152 and passing through the cover insulating layer 158 and the connection pad 200P connected to the connection via 200V and disposed on the upper surface of the cover insulating layer 158.

The seed layer 210 may cover the portion of the upper surface of the uppermost wiring pattern 152 exposed at the bottom surface of the via opening 158O, the surface of the cover insulating layer 158 of the internal surface of the via opening 158O, and a portion of the upper surface of the cover insulating layer 158 adjacent to the via opening 158O.

The terminal base layer 220 may include the internal base portion 220I disposed inside the barrier portion 230W of the terminal cover layer 230 and the external base portion 220O disposed outside the barrier portion 230W of the terminal cover layer 230. The internal base portion 220I and the external base portion 220O of the terminal base layer 220 of the connection terminal 200 may be spaced apart from each other with the barrier portion 230W interposed. In the internal base portion 220I, the portion positioned in the via opening 158O may be a part of the connection via 200V. In the internal base portion 220I, the portion positioned outside the via opening 158O, that is, the portion positioned at the level higher than the upper surface of the cover insulating layer 158 and the external base portion 220O may be a part of the connection pad 200P.

The terminal cover layer 230 may include the barrier portion 230W filling the terminal groove 220G and the cover base portion 230B covering the terminal base layer 220 and the barrier portion 230W. The barrier portion 230W may be a ring-shaped cylinder. The barrier portion 230W may be horizontally adjacent to the via opening 158O and may surround the via opening 158O. The terminal cover layer 230 may have the dent in the upper surface of the cover base portion 230B along the barrier portion 230W.

The terminal protective layer 240 may cover the upper surface of the terminal cover layer 230. In the upper surface of the terminal protective layer 240, the dent portion 200G obtained by transcribing the dent of the terminal cover layer 230 may be provided. That is, in the upper surface of the connection terminal 200, the dent portion 200G may be provided along the barrier portion 230W. The dent portion 200G may have a ring shape. The dent portion 200G may be horizontally adjacent to the connection via 200V filling the via opening 158O and may at least partially surround the connection via 200V.

Figure 8:
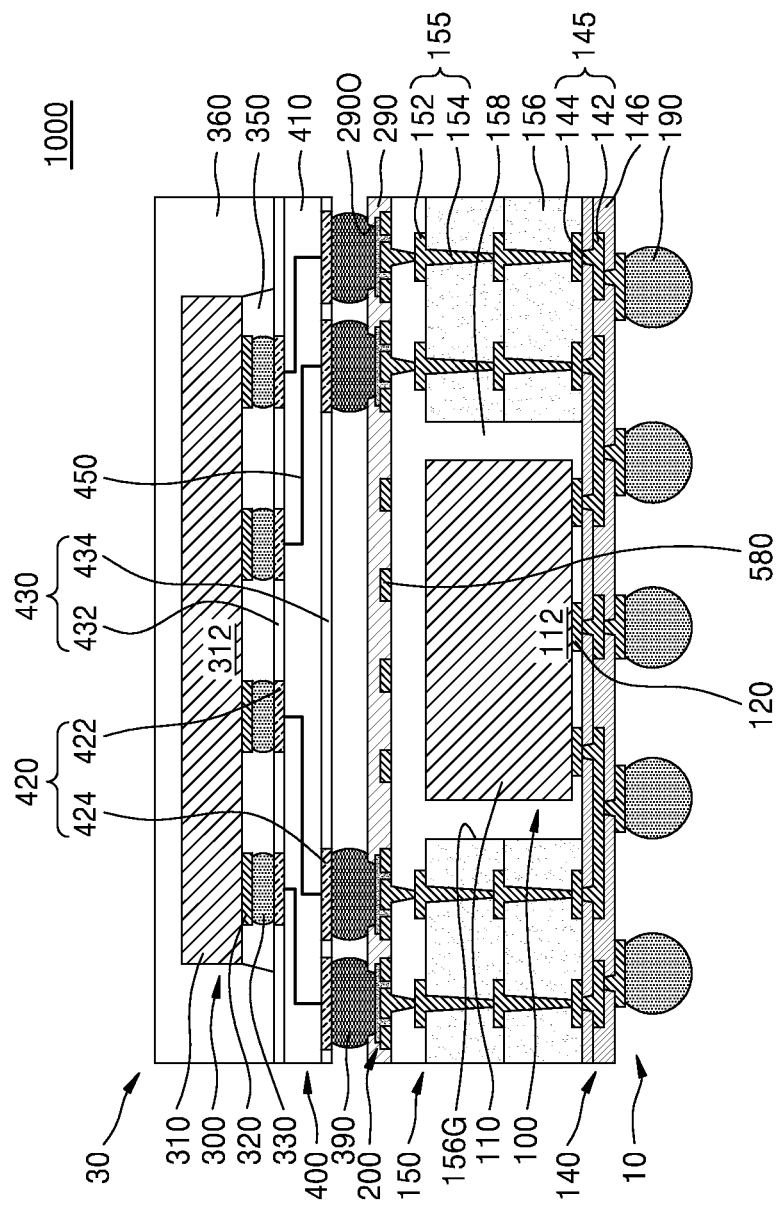
FIG. 8 is a cross-sectional view of a package-on-package (PoP) semiconductor device including a semiconductor package according to embodiments of the inventive concept.

FIG. 8 is a cross-sectional view of a PoP semiconductor package 1000 according to embodiments of the inventive concept.

Referring to FIG. 8, the PoP 1000 includes a second semiconductor package 30 vertically stacked on the semiconductor package 10. Thus, the semiconductor package 10 may be a lower semiconductor package and the second semiconductor package 30 may be an upper semiconductor package. Here, the first semiconductor package 10 may as described in FIGS. 1A and 1B.

The second semiconductor package 30 may include at least one second semiconductor chip 300. The second semiconductor package 30 may be electrically connected to the first semiconductor package 10 through package connection terminals 390 attached to the connection terminals 200 of the first semiconductor package 10.

The second semiconductor chip 300 may include a semiconductor substrate 310 on an active surface of which a second semiconductor device 312 is formed and second chip connection pads 320 disposed on the active surface of the second semiconductor substrate 310. Here, the semiconductor substrate 310, the second semiconductor device 312, and the plurality of second chip connection pads 320 are similar to the semiconductor substrate 110, the semiconductor device 112, and the chip connection pads 120 described with reference to FIGS. 1A and 1B.

The second semiconductor chip 300 may be a memory semiconductor chip, such as a DRAM chip, an SRAM chip, a flash memory chip, an EEPROM chip, a PRAM chip, an MRAM chip, or an RRAM chip.

In FIG. 8, the second semiconductor chip 300 of the second semiconductor package 30 is illustrated as being mounted on a package base substrate 400 by a flip chip method. However, the inventive concept is not limited thereto. The PoP 1000 may include any type of semiconductor package including the at least one second semiconductor chip 300 and the plurality of package connection terminals 390 thereunder so as to be electrically connected to the first semiconductor package 10 as the upper semiconductor package.

The package base substrate 400 may include a base board layer 410 and board pads 420 disposed on upper and lower surfaces of the base board layer 410. The board pads 420 may include a top board pads 422 disposed on the upper surface of the base board layer 410 and bottom board pads 424 disposed on the lower surface of the base board layer 410. In some embodiments, the package base substrate 400 may be a printed circuit board (PCB). For example, the package base substrate 400 may be a multi-layer PCB. The base board layer 410 may be formed of at least one material selected from phenol resin, epoxy resin, and polyimide.

On the upper and lower surfaces of the base board layer 410, solder resist layers 430 exposing the board pads 420 may be formed. The solder resist layers 430 may include a top solder resist layer 432 covering the upper surface of the base board layer 410 and exposing the top board pads 422 and a bottom solder resist layer 434 covering the lower surface of the base board layer 410 and exposing the bottom board pads 424.

The package base substrate 400 may include board wiring lines 450 electrically connecting the top board pads 422 to the bottom board pads 424 in the base board layer 410. The board wiring lines 450 may include board wiring lines and board wiring vias. The board wiring lines 450 may be formed of Cu, Ni, stainless steel, or BeCu. In some embodiments, the board wiring lines 450 may be disposed between the upper surface of the base board layer 410 and the top solder resist layer 432 and/or between the lower surface of the base board layer 410 and the bottom solder resist layer 434.

The top board pads 422 may be electrically connected to the second semiconductor chip 300. For example, between the second chip connection pads 320 of the second semiconductor chip 300 and the top board pads 422 of the package base substrate 400, chip connection terminals 330 may be disposed and may electrically connect the second semiconductor chip 300 to the package base substrate 400. In some embodiments, between the second semiconductor chip 300 and the package base substrate 400, an under-fill layer 350 surrounding the chip connection terminals 330 may be interposed. The under-fill layer 350 may be formed of, for example, epoxy resin formed by a capillary under-fill method. In some embodiments, the under-fill layer 350 may be a non-conductive film (NCF).

On the package base substrate 400, a molding layer 360 surrounding the second semiconductor chip 300 may be disposed. The molding layer 360 may include, for example, the EMC. In some embodiments, the molding layer 360 may cover an inactive surface of the second semiconductor chip 300. In other embodiments, the molding layer 360 may cover side surfaces of the second semiconductor chip 300 and may not cover the inactive surface of the second semiconductor chip 300 and, onto the inactive surface of the second semiconductor chip 300, a heat dissipation member may be attached. Between the heat dissipation member and the inactive surface of the second semiconductor chip 300, a thermal interface material (TIM) may be interposed.

The package connection terminals 390 may be attached to the bottom board pads 424. The package connection terminals 390 may be interposed between the connection terminals 200 and the bottom board pads 424 and may electrically connect the first semiconductor package 10 to the second semiconductor package 30.

Figure 9:
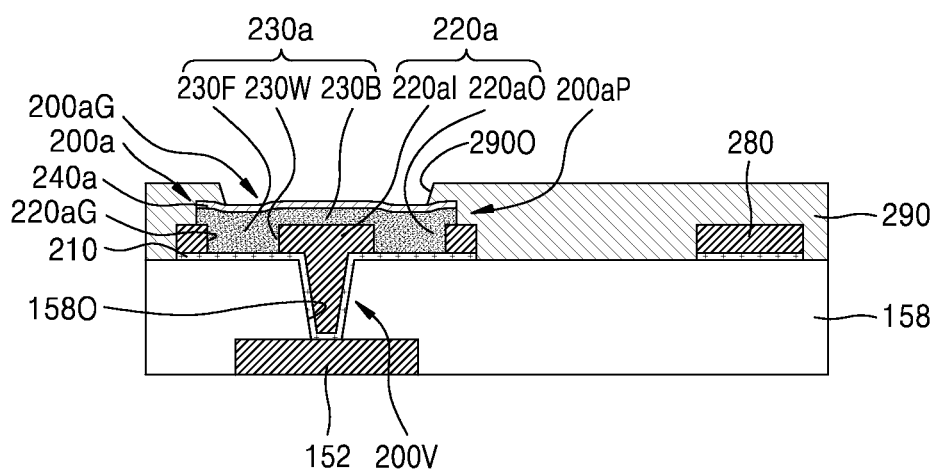
FIG. 9 is a partial cross-sectional view illustrating a connection terminal of a semiconductor package according to embodiments of the inventive concept.
Figure 10A:
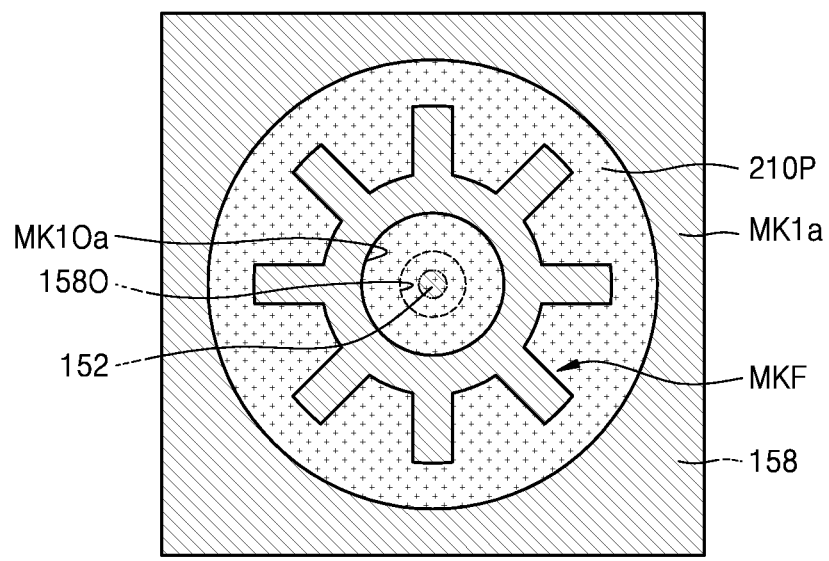
FIGS. 10A and 10B are partial plan views illustrating a method of manufacturing a connection terminal of a semiconductor package according to embodiments of the inventive concept.
Figure 10B:
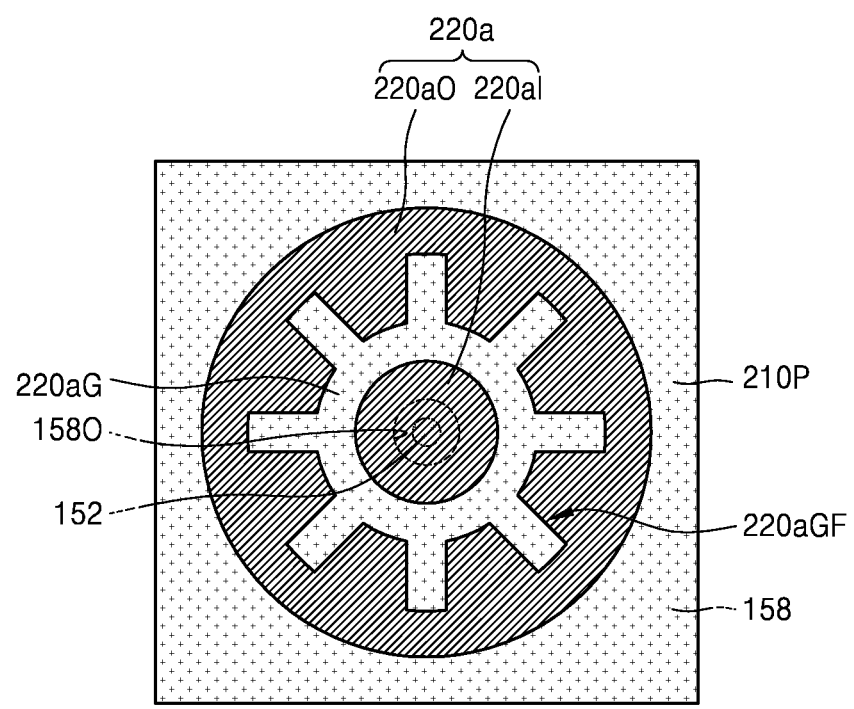
Figure 10C:
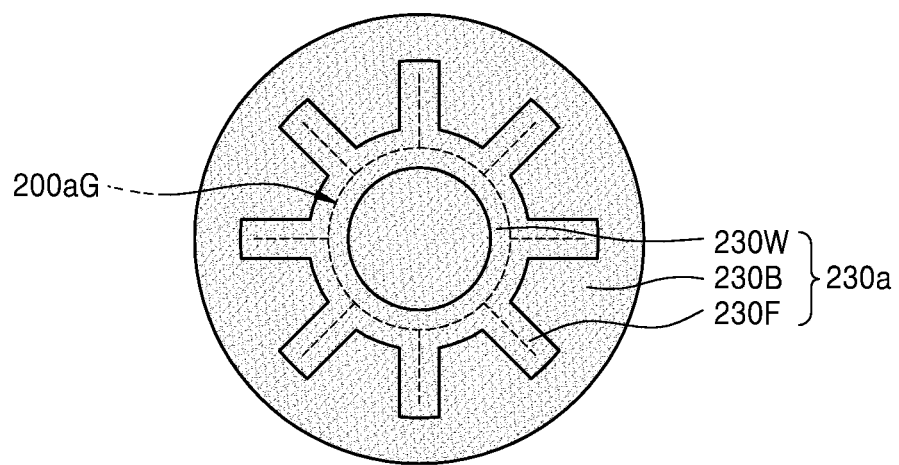
FIG. 10C is a partial bottom plan view of a terminal cover layer of a connection terminal of a semiconductor package.

FIG. 9 is a partial cross-sectional view further illustrating in on example a connection terminal 200a of a semiconductor package according to embodiments of the inventive concept. FIGS. 10A and 10B are partial plan views illustrating in one example a method of manufacturing the connection terminal 200a of the semiconductor package according to embodiments of the inventive concept. FIG. 10C is a partial, bottom plan view of a terminal cover layer of the connection terminal 200a of the semiconductor package.

Referring to FIGS. 9, 10A, 10B and 10C, the connection terminal 200a may include a connection via 200V filling a via opening 158O extending from an upper surface of a cover insulating layer 158 to an upper surface of the uppermost wiring pattern 152 and passing through the cover insulating layer 158 and a connection pad 200aP connected to the connection via 200V and disposed on the upper surface of the cover insulating layer 158. The connection terminal 200a may include a seed layer 210, a terminal base layer 220a, a terminal cover layer 230a, and a terminal protective layer 240a.

The terminal base layer 220a may include an internal base portion 220aI disposed inside a barrier portion 230W of the terminal cover layer 230a and an external base portion 220aO disposed outside the barrier portion 230W of the terminal cover layer 230a. The internal base portion 220aI and the external base portion 220aO of the terminal base layer 220a of the connection terminal 200a may be spaced apart from each other with the barrier portion 230W and first finger portions 230F interposed. Between the internal base portion 220aI and the external base portion 220aO of the terminal base layer 220a, a terminal groove 220aG may be limited. The terminal groove 220aG may include second finger portions 220aGF corresponding to the first finger portions 230F.

The terminal cover layer 230a may include the barrier portion 230W and the first finger portions 230F filling the terminal groove 220aG and a cover base portion 230B covering the terminal base layer 220a, the barrier portion 230W, and the first finger portions 230F. The barrier portion 230W may be a ring-shaped cylinder. Each of the first finger portions 230F may be a bar-shaped, flat plate extending from the barrier portion 230W towards the edges of the terminal cover layer 230a.

The terminal cover layer 230a may have a dent in an upper surface of the cover base portion 230B along the barrier portion 230W and the first finger portions 230F.

The terminal protective layer 240a may cover an upper surface of the terminal cover layer 230a. In an upper surface of the terminal protective layer 240a, a dent portion 200aG obtained by transcribing the dent of the terminal cover layer 230a may be provided. That is, in an upper surface of the connection terminal 200a, along the barrier portion 230W, the dent portion 200aG may be provided. The dent portion 200aG may have a ring shape with bars extending from the ring towards the edge of the connection terminal 200a.

As illustrated in FIG. 10A, the connection terminal 200a may be formed using a first mask layer MK1a with a first mask opening MK1Oa exposing a portion of an upper surface of a preliminary seed layer 210P on the preliminary seed layer 210P and filling a space corresponding to the first mask opening MK1Oa with the first metal. The first mask opening MK1Oa may correspond to a position in which the terminal base layer 220a and the connection wiring line 280 illustrated in FIG. 9 are disposed. The first mask layer MK1a may include finger patterns MKF corresponding to the first finger portions 230F.

Then, similar to the approach described in relation to FIG. 6, a second mask layer MK2 with a second mask opening MK2O is formed. Then, on a portion of the terminal base layer 220a exposed by the second mask opening MK2O without being covered with the second mask layer MK2 and a portion of the preliminary seed layer 210P, the terminal cover layer 230a and the terminal protective layer 240a may be sequentially formed. The terminal cover layer 230a may include the barrier portion 230W and the first finger portions 230F filling the terminal groove 220aG of the terminal base layer 220a and the cover base portion 230B covering the barrier portion 230W, the first finger portions 230F, and the terminal base layer 220a.

The barrier portion 230W may be interposed between the internal base portion 220aI and the external base portion 220aO of the terminal base layer 220a and the first finger portions 230F may extend from the barrier portion 230W to the external base portion 220aO. Therefore, when a portion of the terminal base layer 220a, for example, a portion of the external base portion 220aO is damaged, the internal base portion 220aI may not be damaged due to the barrier portion 230W and a damaged portion may be reduced in the external base portion 220a due to the first finger portions 230F.

Figure 11:
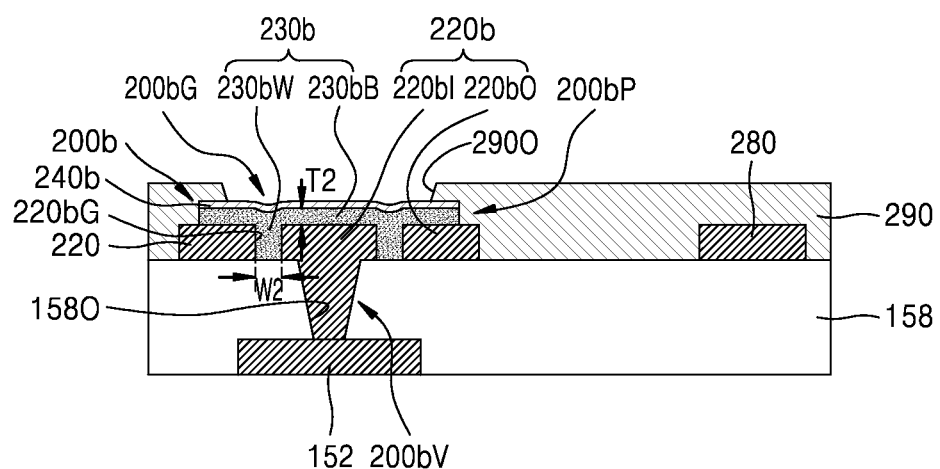
FIG. 11 is a partial cross-sectional view illustrating a connection terminal of a semiconductor package according to embodiments of the inventive concept.
Figure 12A:
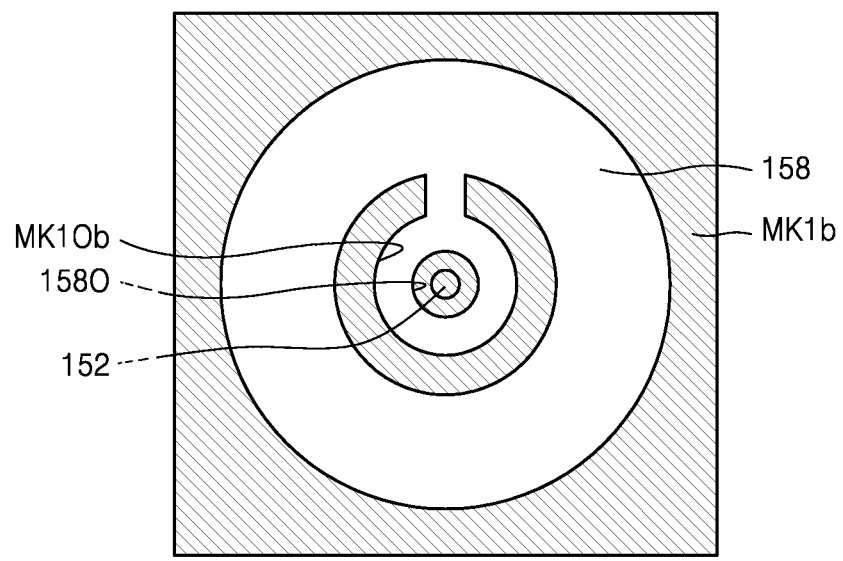
FIGS. 12A and 12B are partial plan views illustrating a method of manufacturing a connection terminal of a semiconductor package according to embodiments of the inventive concept.
Figure 12B:
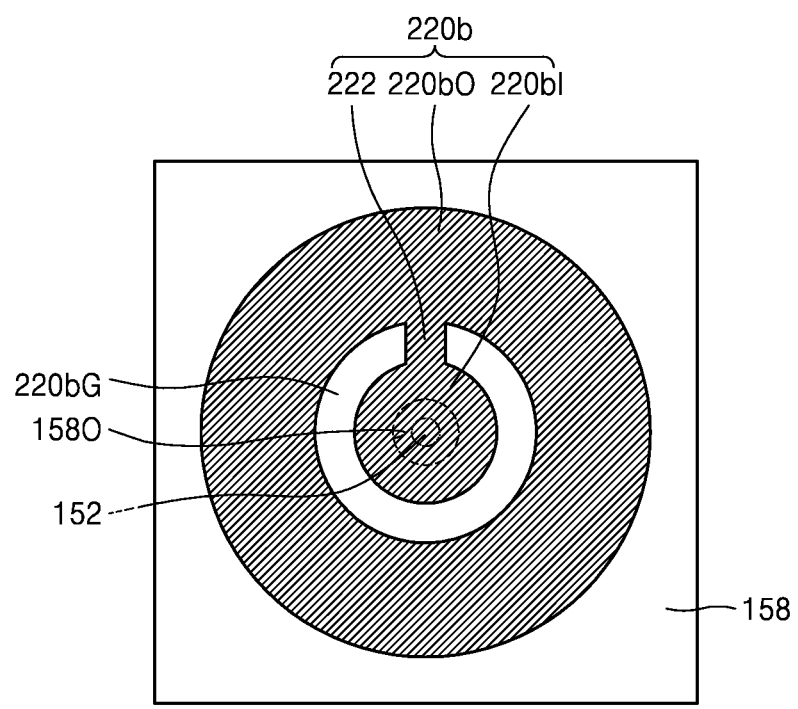
Figure 12C:
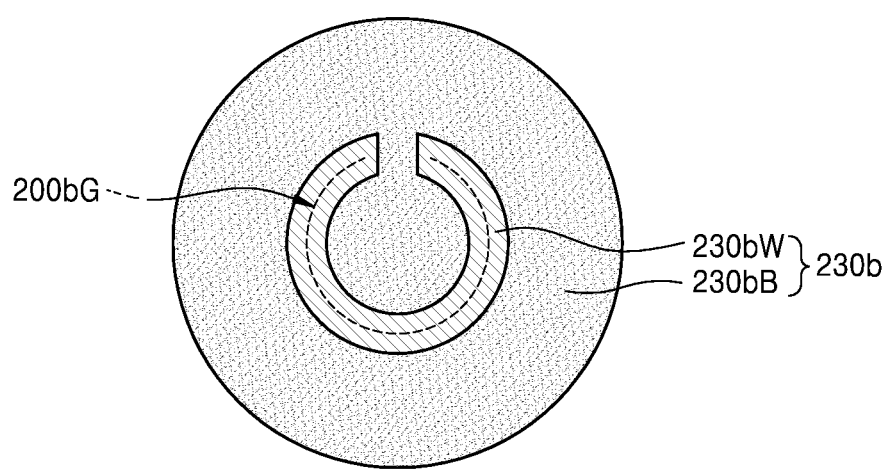
FIG. 12C is a partial bottom plan view of a terminal cover layer of a connection terminal of a semiconductor package.

FIG. 11 is a partial cross-sectional view illustrating in one example a connection terminal 200b of a semiconductor package according to embodiments of the inventive concept. FIGS. 12A and 12B are partial plan views illustrating in one example a method of manufacturing the connection terminal 200b of a semiconductor package according to embodiments of the inventive concept step by step. FIG. 12C is a partial bottom plan view of a terminal cover layer of the connection terminal 200b of a semiconductor package.

Referring to FIGS. 11, 12A, 12B and 12C, the connection terminal 200b may include a connection via 200bV filling a via opening 158O extending from an upper surface of a cover insulating layer 158 to an upper surface of the upper-most wiring pattern 152 and passing through the cover insulating layer 158 and a connection pad 200bP connected to the connection via 200bV and disposed on the upper surface of the cover insulating layer 158. The connection terminal 200b may include a terminal base layer 220b, a terminal cover layer 230b, and a terminal protective layer 240b. The connection terminal 200b may not include the seed layer 210 as compared with the connection terminals 200 and 200a described in relation to FIGS. 1A to 10C, inclusive.

The terminal base layer 220b filling the via opening 158O and covering a portion of the upper surface of the cover insulating layer 158 may be disposed on the cover insulating layer 158. The terminal base layer 220b may include a terminal groove 220bG exposing a portion of the upper surface of the cover insulating layer 158.

The terminal base layer 220b may include an internal base portion 220bI disposed inside a barrier portion 230bW of the terminal cover layer 230b and an external base portion 220b0 disposed outside the barrier portion 230bW of the terminal cover layer 230b and a connection base portion 222 connecting the internal base portion 220bI to the external base portion 220b0. The internal base portion 220bI, the external base portion 220b0, and the connection base portion 222 of the terminal base layer 220b may be integrated with each other.

The terminal groove 220bG of the terminal base layer 220b may have an arc shape or an opened-ring shape. The terminal groove 220bG may extend from an upper surface of the terminal base layer 220 to a lower surface of the terminal base layer 220. That is, the terminal groove 220bG may be of an arc with a portion opened by the connection base portion 222. The terminal groove 220bG may be horizontally adjacent to the via opening 158O and may extend along a circumference of the via opening 158O.

The terminal cover layer 230b may include the barrier portion 230bW filling the terminal groove 220bG and a cover base portion 230bB covering the terminal base layer 220b and the barrier portion 230bW. A horizontal width W2 of the barrier portion 230bW of the terminal cover layer 230b may have a value greater than a thickness T2 of the cover base portion 230bB and less than twice the thickness T2 of the cover base portion 230bB. The barrier portion 230bW may have an arc shape or an opened-ring shape. That is, the terminal groove 220bG may have an open-ring shape wherein the opening portion is the connection base portion 222.

In an upper surface of the cover base portion 230bB of the terminal cover layer 230b, along the barrier portion 230bW, a dent may be provided.

The terminal protective layer 240b may cover an upper surface of the terminal cover layer 230b. In an upper surface of the terminal protective layer 240b, a dent portion 200bG obtained by transcribing the dent of the terminal cover layer 230b may be provided. That is, in an upper surface of the connection terminal 200b, the dent portion 200bG may be provided along the barrier portion 230bW. The dent portion 200bG may have an arc shape or a opened ring shape.

As illustrated in FIG. 12A, the terminal base layer 220b may be formed using a first mask layer MK1b with a first mask opening MK1Ob exposing a portion of the upper surface of the cover insulating layer 158 on the cover insulating layer 158 and filling a space corresponding to the first mask opening MK1Ob with the first metal. In some embodiments, the terminal base layer 220b may be formed by a deposition process. The first mask opening MK1Ob may correspond to a position in which the terminal base layer 220b and the connection wiring line 280 illustrated in FIG. 11 are disposed.

Then, similar to the description presented in relation to FIG. 6, a second mask layer MK2 with a second mask opening MK2O is formed. Then, on a portion of the terminal base layer 220b exposed by the second mask opening MK2O without being covered with the second mask layer MK2 and a portion of the cover insulating layer 158, the terminal cover layer 230b and the terminal protective layer 240b may be sequentially formed. The terminal cover layer 230b may be formed by performing electroless plating by using the terminal base layer 220b as a seed. The terminal cover layer 230b may include the barrier portion 230bW filling the terminal groove 220bG of the terminal base layer 220b and the cover base portion 230bB covering the barrier portion 230bW and the terminal base layer 220b.

The barrier portion 230bW may be interposed between the internal base portion 220bI and the external base portion 220b0 of the terminal base layer 220b.

Figure 13:
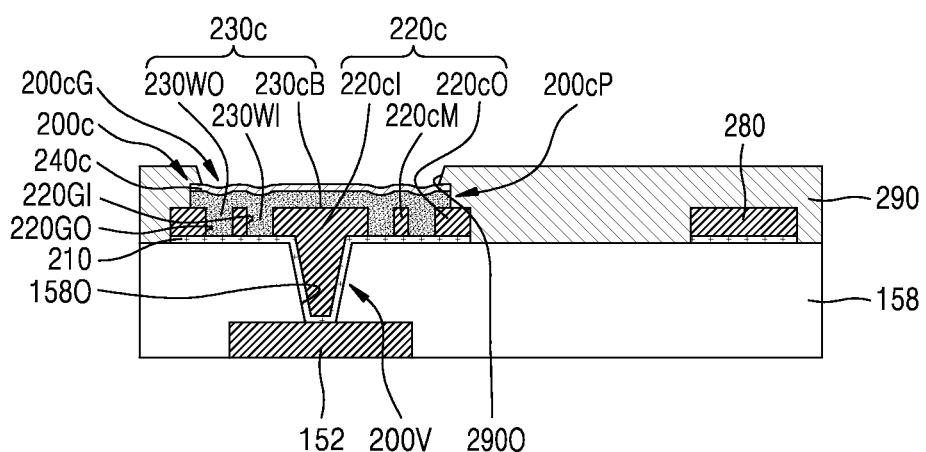
FIG. 13 is a partial cross-sectional view illustrating a connection terminal of a semiconductor package according to embodiments of the inventive concept.
Figure 14A:
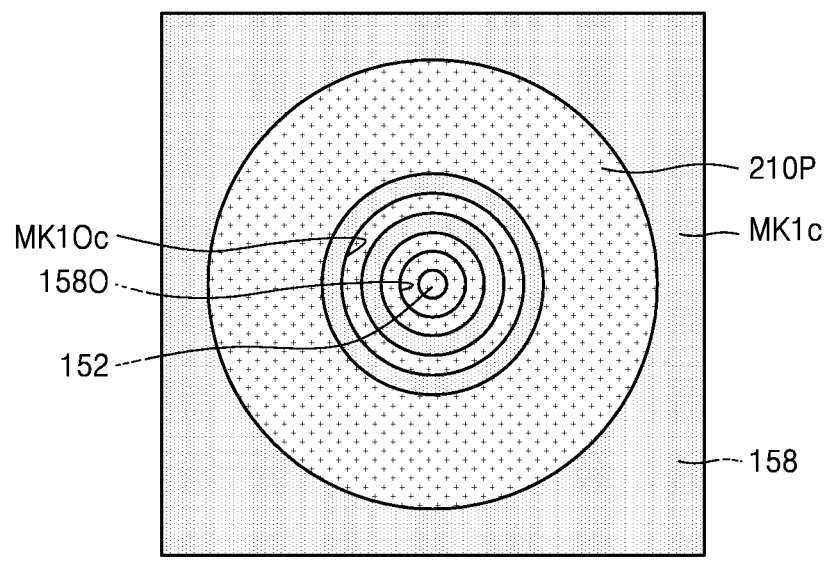
FIGS. 14A and 14B are partial plan views illustrating a method of manufacturing a connection terminal of a semiconductor package according to embodiments of the inventive concept.
Figure 14B:
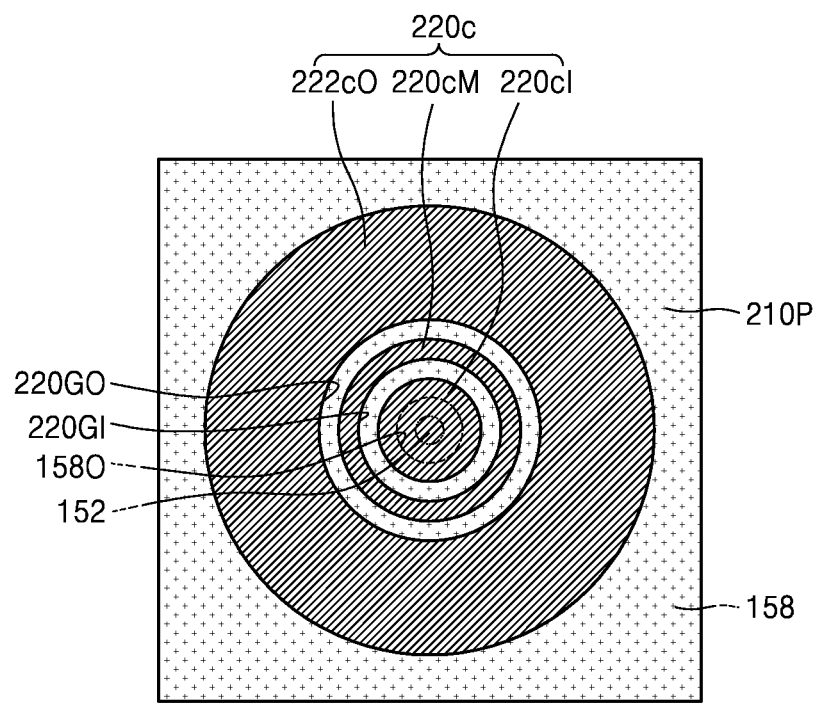
Figure 14C:
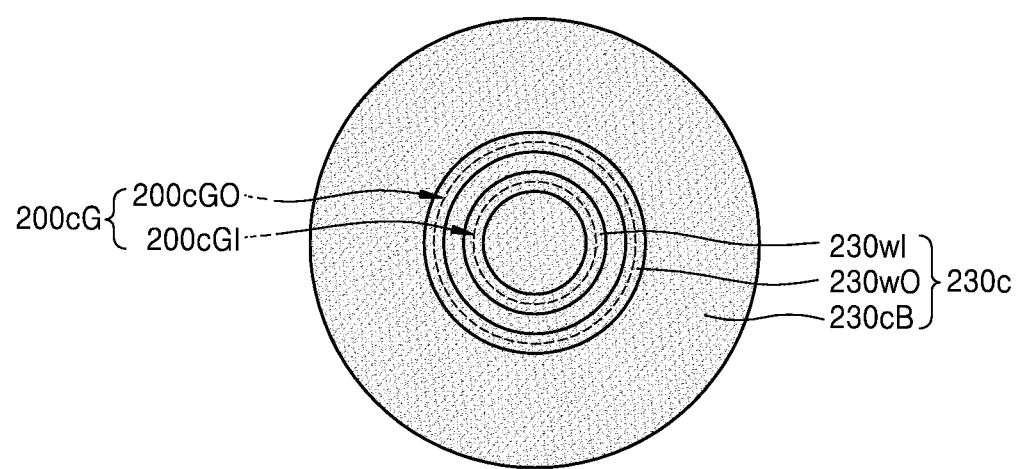
FIG. 14C is a partial bottom plan view of a terminal cover layer of a connection terminal of a semiconductor package.

FIG. 13 is a partial cross-sectional view illustrating in one example a connection terminal 200c of a semiconductor package according to embodiments of the inventive concept. FIGS. 14A and 14B are partial plan views illustrating in one example a method of manufacturing the connection terminal 200c of a semiconductor package according to embodiments of the inventive concept. FIG. 14C is a partial bottom plan view of a terminal cover layer of the connection terminal 200c of a semiconductor package.

Referring to FIGS. 13, 14A, 14B and 14C, the connection terminal 200c may include a connection via 200V filling a via opening 158O extending from an upper surface of a cover insulating layer 158 to an upper surface of the uppermost wiring pattern 152 and passing through the cover insulating layer 158 and a connection pad 200cP connected to the connection via 200V and disposed on the upper surface of the cover insulating layer 158. The connection terminal 200c may include a seed layer 210, a terminal base layer 220c, a terminal cover layer 230c, and a terminal protective layer 240c.

The terminal base layer 220c may include an internal base portion 220cI disposed inside an internal barrier portion 230WI of the terminal cover layer 230c, an intermediate barrier portion 220cM disposed between the internal barrier portion 230WI and an external barrier portion 230WO, and an external base portion 220cO disposed outside the external barrier portion 230WO. The internal base portion 220cI, the intermediate barrier portion 220cM, and the external base portion 220cO of the terminal base layer 220c of the connection terminal 200c may be spaced apart from one another by the internal barrier portion 230WI and the external barrier portion 230WO. Between the internal base portion 220cI and the intermediate barrier portion 220cM of the terminal base layer 220c and between the intermediate barrier portion 220cM and the external base portion 220cO of the terminal base layer 220c, an internal terminal groove 220GI and an external terminal groove 220GO may be limited. Each of the internal terminal groove 220GI and the external terminal groove 220GO may have a ring shape. The internal terminal groove 220GI may be horizontally adjacent to the via opening 158O and may at least partially surround the via opening 158O and the external terminal groove 220GO may at least partially surround the internal terminal groove 220GI. As illustrated in FIGS. 13 and 14B, the base layer 220c may include the two grooves (e.g., the external terminal groove 220GO and the internal terminal groove 220GI). However, the inventive concept is not limited thereto. The terminal base layer 220c may include three or more grooves.

The terminal cover layer 230c may include the internal barrier portion 230WI and the external barrier portion 230WO respectively filling the internal terminal groove 220GI and the external terminal groove 220GO and a cover base portion 230cB covering the terminal base layer 220c, the internal barrier portion 230WI, and the external barrier portion 230WO. Each of the internal barrier portion 230WI and the external barrier portion 230WO may be a ring-shaped cylinder.

In an upper surface of the cover base portion 230cB of the terminal cover layer 230c, a dent may be provided along the internal barrier portion 230WI and the external barrier portion 230WO.

The terminal protective layer 240c may cover an upper surface of the terminal cover layer 230c. In an upper surface of the terminal protective layer 240c, a dent portion 200cG obtained by transcribing the dent of the terminal cover layer 230a may be provided. The dent portion 200cG may include the internal barrier portion 230WI and the external barrier portion 230WO. That is, in an upper surface of the connection terminal 200c, an internal dent portion 200cGI and an external dent portion 200cGO may be provided along the internal barrier portion 230WI and the external barrier portion 230WO. Each of the internal dent portion 200cGI and the external dent portion 200cGO may have a ring shape.

As illustrated in FIG. 14A, the terminal base layer 220c may be formed using a first mask layer MK1c with a first mask opening MK1Oc exposing a portion of an upper surface of a preliminary seed layer 210P on the preliminary seed layer 210P and filling a space corresponding to the first mask opening MK1Oc with the first metal. The first mask opening MK1Oc may correspond to a position in which the terminal base layer 220c and the connection wiring line 280 illustrated in FIG. 13 are disposed.

Then, similar to the description presented in relation to FIG. 6, a second mask layer MK2 with a second mask opening MK2O is formed. Then, on a portion of the terminal base layer 220c exposed by the second mask opening MK2O without being covered with the second mask layer MK2 and a portion of the preliminary seed layer 210P, the terminal cover layer 230c and the terminal protective layer 240c may be sequentially formed.

Figure 15:
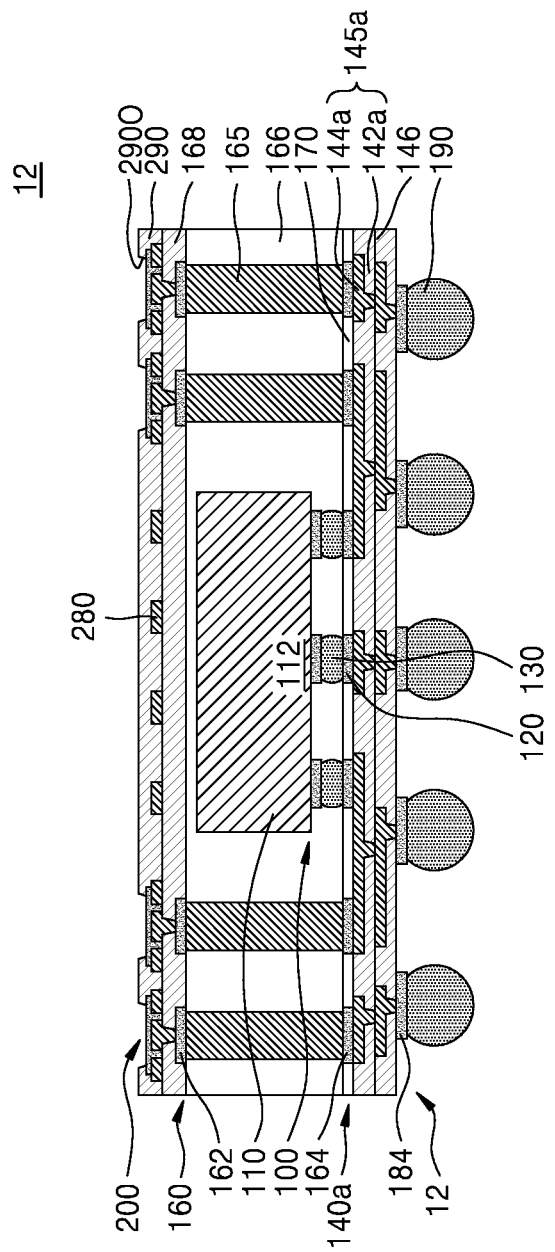
FIG. 15 is a cross-sectional view of a semiconductor package according to embodiments of the inventive concept.
Figure 16:
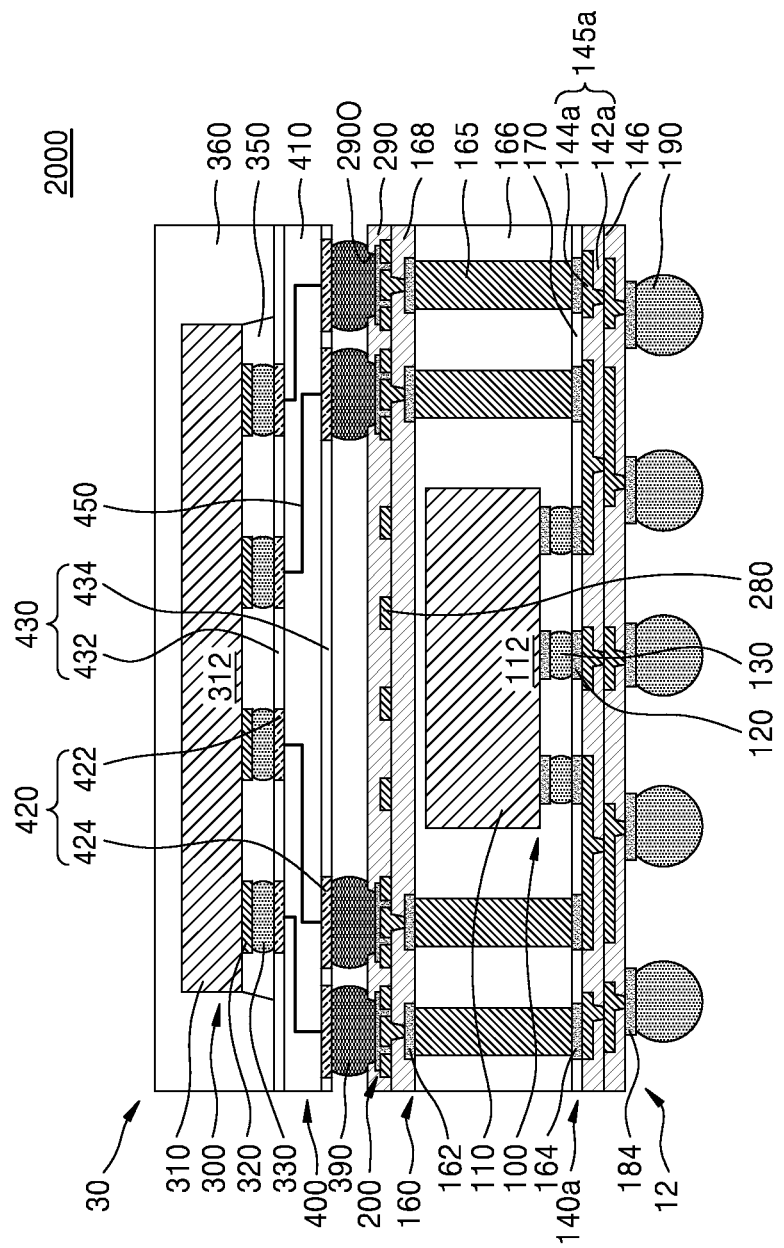
FIG. 16 is a cross-sectional view of a PoP including a semiconductor package according to embodiments of the inventive concept.

FIG. 15 is a cross-sectional view of a semiconductor package 12 according to embodiments of the inventive concept, and FIG. 16 is a cross-sectional view of a PoP semiconductor device 2000 including the semiconductor package 12 according to embodiments of the inventive concept.

Referring to FIG. 15, the semiconductor package 12 may include a redistribution layer 140a, an expanded layer 160 disposed on the redistribution layer 140a, and at least one semiconductor chip 100 disposed in the expanded layer 160. The expanded layer 160 may surround the at least one semiconductor chip 100.

The semiconductor package 12 may be a fan-out type semiconductor package. The semiconductor package 12 may be a fan-out wafer level package (FOWLP). In some embodiments, the semiconductor package 12 may be a chip last FOWLP obtained by forming the redistribution layer 140a first and then, mounting the expanded layer 160 and the at least one semiconductor chip 100 on the redistribution layer 140a.

The redistribution layer 140a may include a redistribution conductive structure 145a and (at least one) redistribution insulating layer 146. The redistribution conductive structure 145a may include redistribution line patterns 142a disposed on at least one of an upper surface and a lower surface of the redistribution insulating layer 146 and redistribution via patterns 145a respectively contacting and connected to portions of the redistribution line patterns 142a through at least a portion of the redistribution insulating layer 146.

At least portions of the redistribution line patterns 142a may be formed and integrated with portions of redistribution via patterns 144a.

In some embodiments, the redistribution via patterns 144a may be tapered such that each of the redistribution via patterns 144a extends with a decreasing horizontal width from an upper side to a lower side. That is, each of the redistribution via patterns 144a may have the horizontal width that decreases as it extends away from the semiconductor chip 100.

The expanded layer 160 may include a filling portion 166, top pads 162 and bottom pads 164 respectively disposed on an upper surface and a lower surface of the filling portion 166, and wiring structures 165 electrically connecting at least some of the top pads 162 to some of the bottom pads 164. The wiring structures 165 may pass through the filling portion 166. The at least some of the top pads 162 and some of the bottom pads 164 may be connected to upper ends and lower ends of the wiring structures 165. The wiring structures 165 may be electrically connected to the redistribution layer 140a through the some of the bottom pads 164. Other bottom pads 164 may be electrically connected to the semiconductor chip 100. Between chip connection pads 120 of the semiconductor chip 100 and other bottom pads 164, chip connection bumps 130 may be disposed and may electrically connect the semiconductor chip 100 to the redistribution layer 140a.

The filling portion 166 may include, for example, the EMC. Each of the wiring structures 165 may be formed of a through mold via (TMV), a conductive pillar, or at least one conductive bump. The filling portion 166 may surround the semiconductor chip 100. In some embodiments, the filling portion 166 may cover side surfaces and an inactive surface of the semiconductor chip 100. In other embodiments, the filling portion 166 may cover the side surfaces of the semiconductor chip 100 and may not cover the inactive surface of the semiconductor chip 100.

In some embodiments, on the filling portion 166, a cover insulating layer 168 covering the top pads 162 may be formed. Connection terminals 200 may be connected to the top pads 162 through the cover insulating layer 168.

Referring to FIG. 16, the PoP 2000 includes a second semiconductor package 30 stacked on a first semiconductor package 12. The first semiconductor package 12 may be a bottom semiconductor package and the second semiconductor package 30 may be a top semiconductor package. Here, the first semiconductor package 12 may have the configuration described in relation to FIG. 15.

Figure 17:
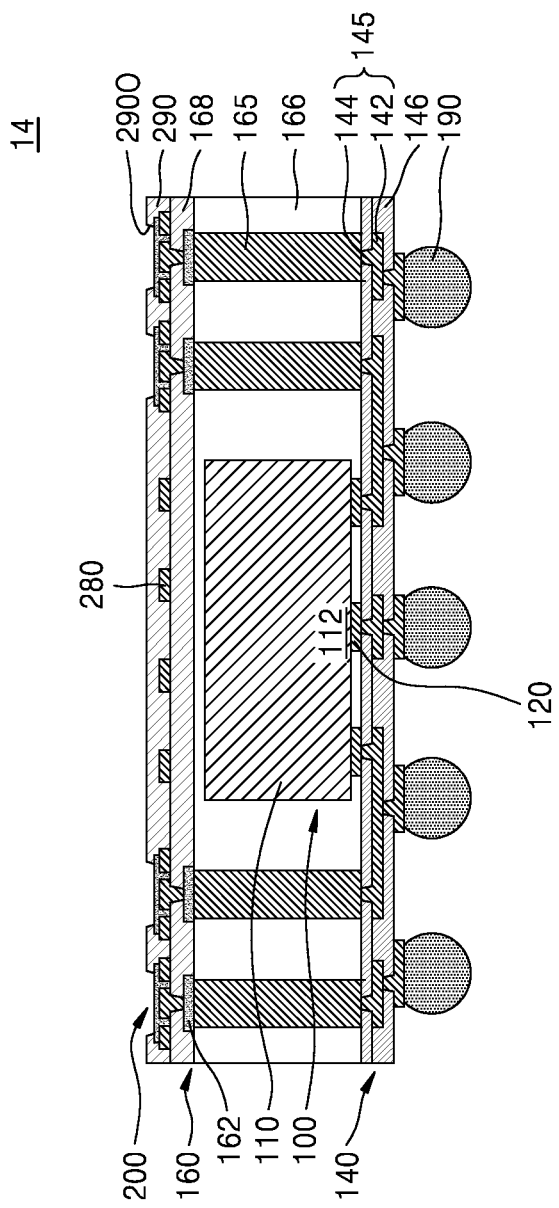
FIG. 17 is a cross-sectional view of a semiconductor package according to embodiments of the inventive concept.
Figure 18:
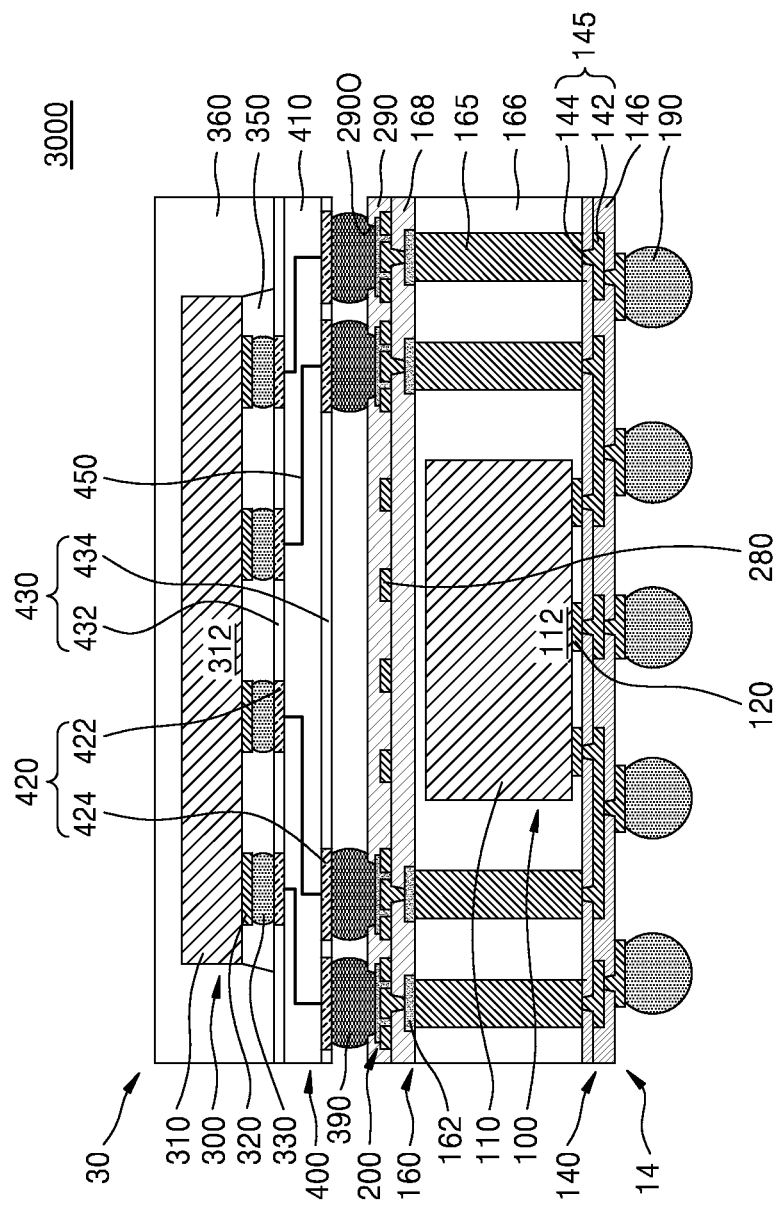
FIG. 18 is a cross-sectional view of a PoP semiconductor device including a semiconductor package according to embodiments of the inventive concept.

FIG. 17 is a cross-sectional view of a semiconductor package 14 according to embodiments of the inventive concept, and FIG. 18 is a cross-sectional view of a PoP semiconductor device 3000 including the semiconductor package 14 according to embodiments of the inventive concept.

Referring to FIG. 17, the semiconductor package 14 may include a redistribution layer 140, an expanded layer 160 disposed on the redistribution layer 140, and at least one semiconductor chip 100 disposed in the expanded layer 160.

The semiconductor package 14 may be a fan-out type semiconductor package. The semiconductor package 14 may be a fan-out wafer level package (FOWLP). In some embodiments, the semiconductor package 14 may be a chip first FOWLP obtained by forming the expanded layer 160 surrounding the at least one semiconductor chip 100 first and then, forming the redistribution layer 140.

Here, the expanded layer 160 is almost the same as the expanded layer 160 described in relation to FIG. 15.

Referring to FIG. 18, the PoP semiconductor device 3000 includes a second semiconductor package 30 stacked on a first semiconductor package 14. The first semiconductor package 14 may be a bottom semiconductor package and the second semiconductor package 30 may be a top semiconductor package. Here, the first semiconductor package 14 may be the same as the semiconductor package 12 described in relation to FIG. 17.

Figure 19:
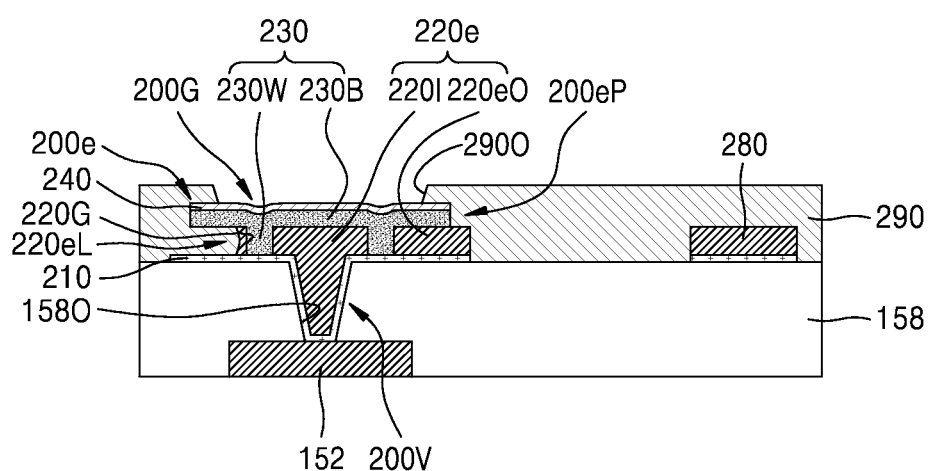
FIG. 19 is a partial cross-sectional view illustrating a connection terminal of a semiconductor package according to embodiments of the inventive concept.

FIG. 19 is a partial cross-sectional view illustrating a connection terminal 200e of a semiconductor package according to embodiments of the inventive concept.

Referring to FIG. 19, the connection terminal 200e may include a terminal base layer 220e, a terminal cover layer 230, and a terminal protective layer 240. In some embodiments, the connection terminal 200e may further include a seed layer 210. The terminal base layer 220e may include an internal base portion 220eI disposed inside a barrier portion 230W of the terminal cover layer 230 and an external base portion 220eO disposed outside the barrier portion 230W of the terminal cover layer 230. Between a cover base portion 230B of the terminal cover layer 230 and the cover insulating layer 158, a loss space 220eL extending toward the center of the terminal base layer 220e may be provided. The loss space 220eL may be a portion damaged by Galvanic corrosion in the external base portion 220O illustrated in FIG. 1B. The loss space 220eL may be positioned outside the barrier portion 230W of the cover layer 230.

Because, in the connection terminal 200e, although the loss space 220eL is formed, the internal base portion 220I may not be damaged due to the barrier portion 230W, connection reliability of the connection terminal 200e may be secured.

Figure 20:
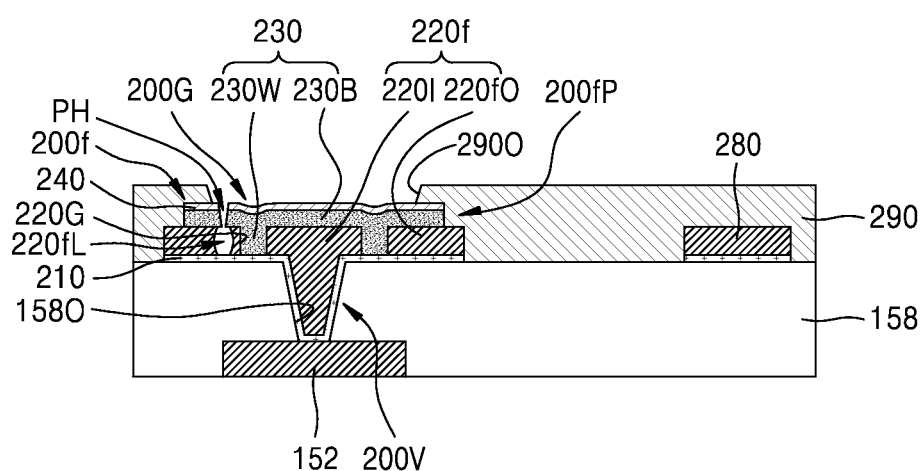
FIG. 20 is a partial cross-sectional view illustrating a connection terminal of a semiconductor package according to embodiments of the inventive concept.

FIG. 20 is a partial cross-sectional view illustrating a connection terminal 200f of a semiconductor package according to embodiments of the inventive concept.

Referring to FIG. 20, the connection terminal 200f may include a terminal base layer 220f, a terminal cover layer 230, and a terminal protective layer 240. In some embodiments, the connection terminal 200f may further include a seed layer 210. The connection terminal 200f may include an internal base portion 220fI disposed inside the barrier portion 230W of the terminal cover layer 230 and an external base portion 220fO disposed outside the barrier portion 230W of the terminal cover layer 230.

The connection terminal 200f may include a pin hole PH passing through the terminal protective layer 240 and the terminal cover layer 230. The connection terminal 200f may include a loss space 220fL connected to the pin hole PH and positioned between the cover base portion 230B of the cover layer 230 and the cover insulating layer 158. The loss space 220fL may be a portion damaged by Galvanic corrosion in the external base portion 220O illustrated in FIG. 1B. The loss space 220fL may be positioned outside the barrier portion 230W of the cover layer 230.

Because, in the connection terminal 200f, although the loss space 220fL is formed, the internal base portion 220I may not be damaged due to the barrier portion 230W, connection reliability of the connection terminal 200f may be secured.

While the inventive concept has been particularly shown and described with reference to embodiments thereof, it will be understood that various changes in form and details may be made therein without departing from the spirit and scope of the following claims.

What is claimed is:
1. A semiconductor package comprising:
a redistribution layer;
a semiconductor chip disposed on the redistribution layer and an expanded layer at least partially surrounding the semiconductor chip;

connection terminals on the expanded layer; and
a wiring structure electrically connecting the redistribution layer to the connection terminals,
wherein each of the connection terminals comprises a seed layer, a terminal base layer including a terminal groove exposing a portion of an upper surface of the seed layer on the seed layer and formed of a first metal, a terminal cover layer including a barrier portion filling the terminal groove and a cover base portion covering the barrier portion and the terminal base layer and formed of a second metal, and a terminal protective layer covering the terminal cover layer and formed of a third metal.

2. The semiconductor package of claim 1, wherein the third metal has electro-potential higher than that of the first metal.

3. The semiconductor package of claim 2, wherein the second metal has electro-potential higher than that of the first metal and lower than that of a third metal.

4. The semiconductor package of claim 1, wherein the terminal base layer comprises an internal base and an external base spaced apart from each other by the barrier portion of the terminal cover layer that interposes.

5. The semiconductor package of claim 1, wherein the barrier portion has a ring shape.

6. The semiconductor package of claim 1, further comprising:
a cover insulating layer covering the expanded layer and having a via opening, wherein the connection terminal includes a connection via filling the via opening and connection pads connected to the connection via and disposed on an upper surface of the cover insulating layer.

7. The semiconductor package of claim 6, wherein the barrier portion is horizontally adjacent to the via opening and at least partially surrounds the via opening.

8. The semiconductor package of claim 1, wherein the terminal cover layer further comprises:
first finger portions extending from the barrier portion towards an edge of the terminal cover layer.

9. The semiconductor package of claim 1, wherein the terminal groove comprises:
an internal terminal groove and an external terminal groove surrounding the internal terminal groove, and
the barrier portion includes an internal barrier portion filling the internal terminal groove and an external barrier portion filling the external terminal groove.

10. The semiconductor package of claim 1, wherein a dent is provided along the barrier portion in an upper surface of the connection terminal.

11. The semiconductor package of claim 1, wherein a horizontal width of the barrier portion is greater than a thickness of the terminal base layer.

12. A semiconductor package comprising:
a redistribution layer;
a semiconductor chip disposed on the redistribution layer and an expanded layer at least partially surrounding the semiconductor chip;
a cover insulating layer covering the expanded layer and having a via opening;
a connection terminal including a connection via filling the via opening and connection pads connected to the connection via and disposed on an upper surface of the cover insulating layer; and
a wiring structure electrically connecting the redistribution layer to the connection terminal,
wherein the connection terminal comprises a terminal base layer including a terminal groove, a terminal cover layer including a barrier portion filling the terminal groove and a cover base portion covering the barrier portion and the terminal base layer, and a terminal protective layer covering the terminal cover layer and a dent is provided along the barrier portion in an upper surface of the connection terminal.

13. The semiconductor package of claim 12, wherein the terminal groove extends from an upper surface of the terminal base layer to a lower surface of the terminal base layer and the cover insulating layer is exposed at a bottom surface of the terminal groove.

14. The semiconductor package of claim 12, wherein the terminal base layer comprises:
an internal base portion disposed inside the barrier portion and an external base portion disposed outside the barrier portion and a connection base portion connecting the internal base portion and the external base portion.

15. The semiconductor package of claim 14, wherein the terminal groove is horizontally adjacent to the via opening and at least partially surrounds the via opening, and
the barrier portion has an opened ring shape with an opening formed by the connection base portion.

16. The semiconductor package of claim 12, wherein the terminal base layer comprises copper (Cu), the cover base layer comprises nickel (Ni), and the terminal cover layer comprises gold (Au).

17. A package-on-package (PoP) semiconductor device, comprising:
a first semiconductor package including a redistribution layer, a first semiconductor chip disposed on the redistribution layer and an expanded layer at least partially surrounding the first semiconductor chip, a cover insulating layer covering the expanded layer and having a via opening, and a connection terminal filing the via opening and extending to an upper surface of the cover insulating layer to be electrically connected to the redistribution layer; and
a second semiconductor package, vertically stacked on the first semiconductor device, and including a second semiconductor chip and a package connection terminal attached to the connection terminal to electrically connect the second semiconductor chip to the first semiconductor package,
wherein the connection terminal comprises a terminal base layer with a terminal groove, a terminal cover layer including a barrier portion filling the terminal groove and a cover base portion covering the terminal base layer, and a terminal protective layer covering the terminal cover layer and, a dent provided along the barrier portion in an upper surface of the connection terminal.

18. The PoP semiconductor device of claim 17, wherein a metal forming the terminal protective layer has electro-potential higher than that of a metal forming the terminal base layer.

19. The PoP semiconductor device of claim 17, wherein the terminal base layer comprises an internal base and an external base spaced apart from each other with a barrier portion of the terminal cover layer interposed.

20. The PoP semiconductor device of claim 19, wherein a loss space is provided outside the barrier portion of the terminal cover layer between the cover base portion and the cover insulating layer.

* * * * *